United States Patent
Niroomand et al.

(10) Patent No.: US 7,732,343 B2
(45) Date of Patent: Jun. 8, 2010

(54) SIMPLIFIED PITCH DOUBLING PROCESS FLOW

(75) Inventors: Ardavan Niroomand, Boise, ID (US); Baosuo Zhou, Boise, ID (US); Ramakanth Alapati, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/744,074

(22) Filed: May 3, 2007

(65) Prior Publication Data

US 2007/0238299 A1    Oct. 11, 2007

Related U.S. Application Data

(63) Continuation of application No. 11/400,603, filed on Apr. 7, 2006.

(51) Int. Cl.
*H01L 21/302* (2006.01)

(52) U.S. Cl. .............. 438/725; 438/706; 257/E21.038; 257/E21.039

(58) Field of Classification Search .......... 438/706, 438/725; 257/E21.038, E21.039
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,452,442 A | 6/1984 | Geschwindner | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,713,756 A | 12/1987 | Mackiewicz | |
| 4,716,131 A | 12/1987 | Okazawa et al. | |
| 4,776,922 A | 10/1988 | Bhattascharyya et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |

(Continued)

FOREIGN PATENT DOCUMENTS

DE    280851    7/1990

(Continued)

OTHER PUBLICATIONS

Bergeron, et al., "Resolution Enhancement Techniques for the 90nm Technology Node and Beyond", Future Fab International, Issue 15, Jul. 11, 2003, 4 pages.

(Continued)

*Primary Examiner*—N Drew Richards
*Assistant Examiner*—Jae Lee
(74) *Attorney, Agent, or Firm*—Knobbe, Martens, Olson & Bear LLP

(57) ABSTRACT

A method for fabricating a semiconductor device comprises patterning a layer of photoresist material to form a plurality of mandrels. The method further comprises depositing an oxide material over the plurality of mandrels by an atomic layer deposition (ALD) process. The method further comprises anisotropically etching the oxide material from exposed horizontal surfaces. The method further comprises selectively etching photoresist material.

13 Claims, 24 Drawing Sheets

U.S. PATENT DOCUMENTS

| | | |
|---|---|---|
| 5,328,810 A | 7/1994 | Lowrey et al. |
| 5,330,879 A | 7/1994 | Dennison |
| 5,470,661 A | 11/1995 | Bailey et al. |
| 5,502,320 A | 3/1996 | Yamada |
| 5,514,885 A | 5/1996 | Myrick |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,905,285 A | 5/1999 | Gardner et al. |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,211,044 B1 | 4/2001 | Xiang et al. |
| 6,282,113 B1 | 8/2001 | Debrosse |
| 6,288,454 B1 | 9/2001 | Allman et al. |
| 6,291,334 B1 | 9/2001 | Somekh |
| 6,297,554 B1 | 10/2001 | Lin |
| 6,330,777 B1 | 12/2001 | Padley |
| 6,335,257 B1 | 1/2002 | Tseng |
| 6,348,380 B1 | 2/2002 | Weimer et al. |
| 6,383,907 B1 | 5/2002 | Hasegawa et al. |
| 6,395,613 B1 | 5/2002 | Juengling |
| 6,404,056 B1 | 6/2002 | Kuge et al. |
| 6,423,474 B1 | 7/2002 | Holscher |
| 6,455,372 B1 | 9/2002 | Weimer |
| 6,475,867 B1 | 11/2002 | Hui et al. |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,627,933 B2 | 9/2003 | Juengling |
| 6,632,741 B1 | 10/2003 | Clevenger |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,707,092 B2 | 3/2004 | Sasaki |
| 6,709,807 B2 | 3/2004 | Hallock et al. |
| 6,734,063 B2 | 5/2004 | Willer et al. |
| 6,734,107 B2 | 5/2004 | Lai et al. |
| 6,744,094 B2 | 6/2004 | Forbes |
| 6,768,663 B2 | 7/2004 | Ogata |
| 6,773,998 B1 | 8/2004 | Fisher et al. |
| 6,777,725 B2 | 8/2004 | Willer et al. |
| 6,794,699 B2 | 9/2004 | Bissey et al. |
| 6,800,930 B2 | 10/2004 | Jackson et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,924,191 B2 | 8/2005 | Liu et al. |
| 6,936,507 B2 | 8/2005 | Tang et al. |
| 6,962,867 B2 | 11/2005 | Jackson et al. |
| 7,015,124 B1 | 3/2006 | Fisher et al. |
| 7,074,668 B1 * | 7/2006 | Park et al. .................. 438/243 |
| 7,084,076 B2 | 8/2006 | Park et al. |
| 7,098,105 B2 | 8/2006 | Juengling |
| 7,115,525 B2 | 10/2006 | Abatchev |
| 7,183,205 B2 | 2/2007 | Hong |
| 7,183,597 B2 | 2/2007 | Doyle |
| 7,208,379 B2 | 4/2007 | Venugopal et al. |
| 7,288,445 B2 | 10/2007 | Bryant et al. |
| 7,291,560 B2 | 11/2007 | Parascandola et al. |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0125536 A1 | 9/2002 | Iwasa et al. |
| 2002/0127810 A1 | 9/2002 | Nakamura et al. |
| 2002/0130348 A1 | 9/2002 | Tran |
| 2002/0130686 A1 | 9/2002 | Forbes |
| 2002/0135029 A1 | 9/2002 | Ping et al. |
| 2002/0158273 A1 | 10/2002 | Satoh et al. |
| 2003/0006410 A1 | 1/2003 | Doyle |
| 2003/0008461 A1 | 1/2003 | Forbes et al. |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0073044 A1 | 4/2003 | Reynolds |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0218199 A1 | 11/2003 | Forbes et al. |
| 2003/0230234 A1 * | 12/2003 | Nam et al. .................. 117/97 |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser |
| 2004/0023502 A1 | 2/2004 | Tzou et al. |
| 2004/0036095 A1 | 2/2004 | Brown et al. |
| 2004/0041189 A1 | 3/2004 | Voshell et al. |
| 2004/0043623 A1 | 3/2004 | Liu |
| 2004/0053475 A1 | 3/2004 | Sharma |
| 2004/0079988 A1 | 4/2004 | Harari |
| 2004/0106257 A1 | 6/2004 | Okamura et al. |
| 2004/0113171 A1 * | 6/2004 | Chiu et al. .................. 257/119 |
| 2004/0157455 A1 * | 8/2004 | Johansson et al. .......... 438/691 |
| 2004/0191997 A1 | 9/2004 | Kawahara et al. |
| 2004/0235255 A1 | 11/2004 | Tanaka |
| 2005/0042879 A1 | 2/2005 | Yin |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0202607 A1 * | 9/2005 | Furukawa et al. .......... 438/157 |
| 2005/0272259 A1 | 12/2005 | Hong |
| 2005/0277249 A1 | 12/2005 | Juengling |
| 2006/0003182 A1 | 1/2006 | Lane et al. |
| 2006/0024940 A1 * | 2/2006 | Furukawa et al. .......... 438/597 |
| 2006/0024945 A1 * | 2/2006 | Kim et al. .................. 438/618 |
| 2006/0028859 A1 | 2/2006 | Forbes |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046407 A1 | 3/2006 | Juengling |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0134909 A1 * | 6/2006 | Nagase et al. ............. 438/637 |
| 2006/0146092 A1 * | 7/2006 | Barnes et al. ............. 347/54 |

| | | | |
|---|---|---|---|
| 2006/0172540 A1 | 8/2006 | Marks et al. | |
| 2006/0189150 A1 | 8/2006 | Jung | |
| 2006/0211260 A1 | 9/2006 | Tran | |
| 2006/0216293 A1 | 9/2006 | Couto | |
| 2006/0216923 A1 | 9/2006 | Tran et al. | |
| 2006/0231900 A1 | 10/2006 | Lee et al. | |
| 2006/0234138 A1 | 10/2006 | Felhaber et al. | |
| 2006/0263699 A1 | 11/2006 | Abatchev | |
| 2006/0267075 A1 | 11/2006 | Sandhu et al. | |
| 2006/0273456 A1 | 12/2006 | Sant | |
| 2006/0278911 A1 | 12/2006 | Eppich | |
| 2006/0281266 A1 | 12/2006 | Wells | |
| 2007/0018345 A1 | 1/2007 | Chao et al. | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |
| 2007/0077717 A1* | 4/2007 | Kim et al. | 438/303 |
| 2007/0145450 A1 | 6/2007 | Wang et al. | |
| 2007/0210449 A1 | 9/2007 | Caspary et al. | |
| 2007/0215874 A1 | 9/2007 | Furukawa et al. | |
| 2007/0215960 A1 | 9/2007 | Zhu et al. | |
| 2007/0275309 A1 | 11/2007 | Liu | |
| 2008/0054350 A1 | 3/2008 | Breitwisch et al. | |

FOREIGN PATENT DOCUMENTS

| | | |
|---|---|---|
| DE | 42 36 609 A1 | 5/1994 |
| DE | 44 08 764 A1 | 9/1994 |
| DE | 199 28 781 C1 | 7/2000 |
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| KR | 1999-0001440 | 1/1999 |
| KR | 1999-027887 | 4/1999 |
| WO | WO 94/15261 | 7/1994 |
| WO | WO 01/01489 A1 | 1/2001 |
| WO | WO 02/099864 A1 | 12/2002 |
| WO | WO 2004/001799 A2 | 12/2003 |
| WO | WO 2004/003977 | 1/2004 |
| WO | WO 2004/073044 A2 | 8/2004 |
| WO | WO 2005/010973 | 2/2005 |
| WO | WO 2005/034215 A1 | 4/2005 |
| WO | WO 2006/026699 A2 | 3/2006 |
| WO | WO 2006/127586 A2 | 11/2006 |

OTHER PUBLICATIONS

Bhave et al., "Developer-soluble Gap fill materials for patterning metal trenches in Via-first Dual Damascene process", preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines", J. Vac.Sci. Technol. B21(4), Jul./Aug. 2003, pp. 1491-1495, Jul./Aug. 2003.

Chung et al., "Nanoscale Multi-Line Patterning Using Sidewall Structure", Jpn., J.App.. Phys. vol. 41 (2002) Pt. 1, No. 6B,pp. 4410-4414, 2002.

Joubert et al., "Nanometer scale linewidth control during etching of polysilicon gates in high-density plasmas", Microelectronic Engineering 69 (2003), pp. 350-357.

Lim et al., "Atomic layer deposition of transition metals", Nature Materials, vol. 2, Nov. 2003, pp. 749-754, 6 pages.

Oehrlein et al., "Pattern transfer into low dielectric materials by high-density plasma etching", Solid State Tech., May 2000, 8 pages.

Sakao et al., "A Straight-Line-Trench Isolation and Trench-Gate Transistor (SLIT) Cell for Giga-bit DRAMs", Proceedings of IEEE VLSI Technology Symposium May 17-19, 1993 Kyoto, Japan, May 17, 1993, pp. 19-20.

Schloesser et al., "Highly Scalable Sub-50nm Vertical Double Gate Trench DRAM Cell", Memory Development Center, Infineon Tech., 2004, 4 pages.

Yan et al., "Scaling the Si MOSFET: From Bulk to SOI to Bulk", IEEE Transactions on Electron Devices USA; vol. 39, No. 7, Jul. 1992, pp. 1704-1710.

U.S. Appl. No. 11/192,828, filed Jul. 29, 2005.
U.S. Appl. No. 11/213,486, filed Aug. 25, 2005.
U.S. Appl. No. 11/215,982, filed Aug. 31, 2005.
U.S. Appl. No. 11/216,613, filed Aug. 30, 2005.
U.S. Appl. No. 11/217,270, filed Sep. 1, 2005.
U.S. Appl. No. 11/219,067, filed Sep. 1, 2005.
U.S. Appl. No. 11/219,346, filed Sep. 1, 2005.
U.S. Appl. No. 11/219,349, filed Sep. 1, 2005.
U.S. Appl. No. 11/219,604, filed Sep. 1, 2005.
U.S. Appl. No. 11/329,755, filed Jan. 11, 2006.
U.S. Appl. No. 11/366,212, filed Mar. 2, 2006.
U.S. Appl. No. 11/367,020, filed Mar. 2, 2006.
"U.S. Appl. No. 11/543,515, filed Oct. 24, 2006".
"Ex parte Cantell, unpublished decision of the Board of Patent Appeals and Interferences, Mar. 4, 2005".

Choi et al., "Sublithographic nanofabrication technology for nanocatalysts and DNA chips," J.Vac. Sci. Technol., Nov./Dec. 2003; pp. 2951-2955.

Bruek, S.R.J., "Optical and interferometric lithography —Nanotechnology enablers," Proceedings of the IEEE, vol. 93, No. 10, Oct. 2005, pp. 1704-1721.

Sheats et al., "Microlithography: Science and Technology," Marcel Dekkar, Inc., pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

International Preliminary Report on Patentability of Oct. 16, 2008 for International Application No. PCT/US2007/011525, filed May 14, 2007.

Office Action of Feb. 20, 2009 in U.S. Appl. No. 11/400,603, filed Apr. 7, 2006.

Park et al., "Mass-productive ultra-low temperature ALD $SiO_2$ process promising for sub-90nm memory and logic devices", Electron Devices Meeting, IEDM '02 Digest. International pp. 229-232 (2002).

Search Report and Written Opinion dated Mar. 15, 2010 in corresponding Singapore Patent Application No. 200807334-8.

* cited by examiner

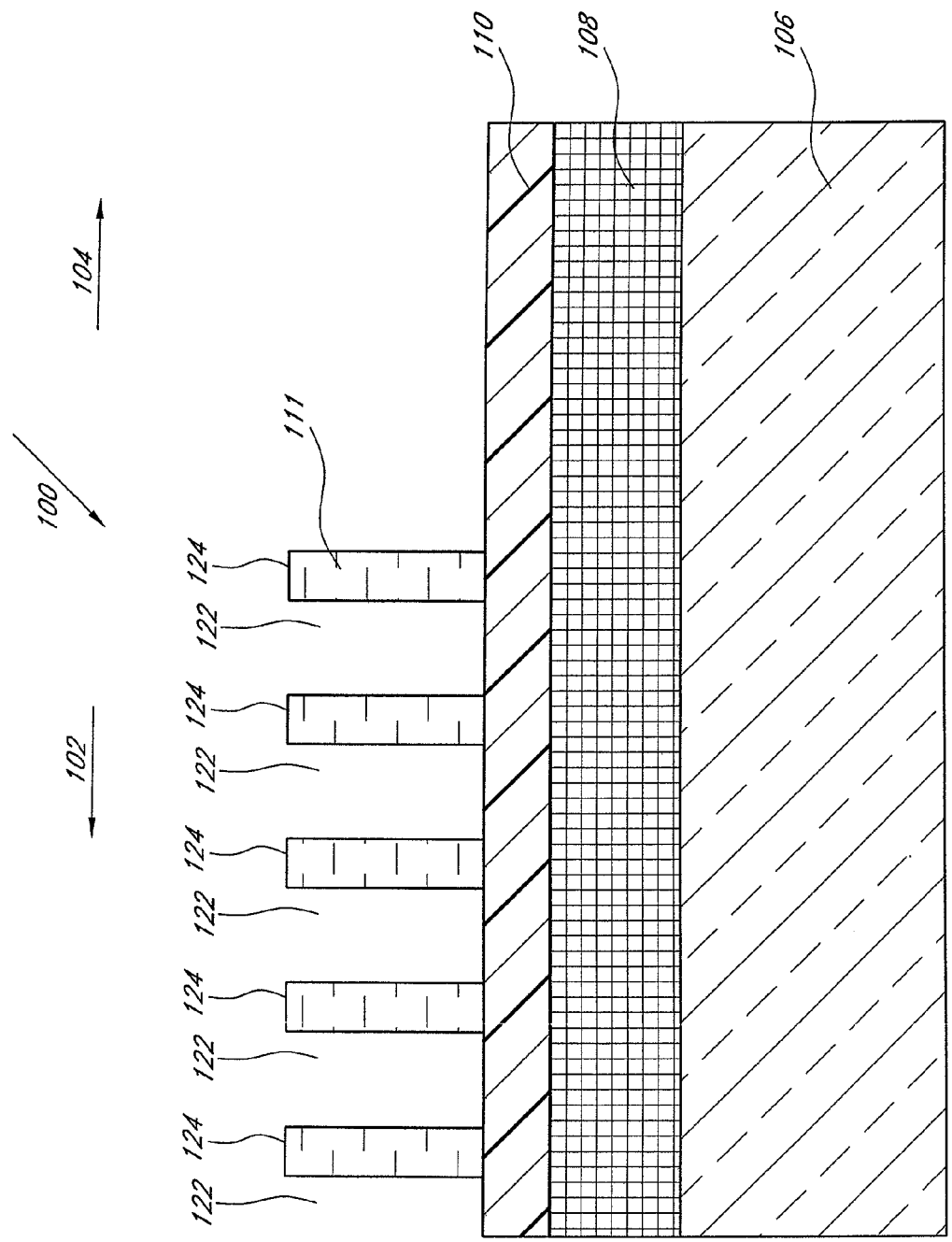

SIMPLIFIED PITCH DOUBLING PROCESS FLOW

PRIORITY APPLICATION

This application is a continuation of U.S. patent application Ser. No. 11/400,603 (filed 7 Apr. 2006), the entire disclosure of which is hereby incorporated by reference herein.

CROSS-REFERENCE TO RELATED APPLICATIONS

This application is related to, and incorporates by reference the entire disclosure of the following: U.S. patent application Ser. No. 11/214,544 (filed 29 Aug. 2005; U.S. patent application Ser. No. 11/219,067 (filed 1 Sep. 2005); U.S. patent application Ser. No. 11/366,212 (filed 2 Mar. 2006); and U.S. patent application Ser. No. 11/367,020 (filed 2 Mar. 2006).

FIELD OF THE INVENTION

The present invention relates generally to integrated circuit fabrication, and more specifically to simplified processes for forming pitch doubled integrated circuit features.

BACKGROUND OF THE INVENTION

Integrated circuits are continuously being made smaller as demand for portability, computing power, memory capacity and energy efficiency in modern electronics grows. Therefore, the size of the integrated circuit constituent features, such as electrical devices and interconnect line widths, is also decreasing continuously. The trend of decreasing feature size is evident in memory circuits or devices such as dynamic random access memory ("DRAM"), flash memory, nonvolatile memory, static random access memory ("SRAM"), ferroelectric ("FE") memory, logic gate arrays and so forth.

For example, DRAM typically comprises millions of identical circuit elements, known as memory cells. A typical memory cell consists of two electrical devices: a storage capacitor and an access field effect transistor. Each memory cell is an addressable location that can store one binary digit ("bit") of data. A bit can be written to a memory cell through the transistor and read by sensing charge on the reference electrode of the storage capacitor. By decreasing the sizes of these constituent electrical devices and the conducting lines that interconnect them, the sizes of the memory devices incorporating memory cells can likewise be decreased. In similar fashion, the storage capacities of these devices can be increased by fitting more memory cells into the memory devices.

As another example, flash memory (for example, electrically erasable programmable read only memory or "EEPROM") is a type of memory that is typically erased and reprogrammed in blocks instead of one byte at a time. A typical flash memory comprises a memory array, which includes a large number of memory cells. The memory cells include a floating gate field effect transistor capable of holding a charge. The data in a memory cell is determined by the presence or absence of charge on the floating gate. The cells are usually grouped into sections called "erase blocks." The memory cells of a flash memory array are typically arranged into a "NOR" architecture (in which each memory cell is directly coupled to a bit line) or a "NAND" architecture (in which memory cells are coupled into "strings" of cells, such that each cell is coupled indirectly to a bit line and requires activating the other cells of the string for access). The memory cells within an erase block can be electrically programmed on a random basis by charging the floating gate. The charge can be removed from the floating gate by a block erase operation, wherein all floating gate memory cells in the erase block are erased in a single operation.

As is evident from the examples provided here, memory devices typically include large patterns or arrays of electrical devices and conductors that are used to interconnect the electrical devices. The "pitch" of such a pattern is defined as the distance between an identical point in two neighboring features in the pattern. These features are typically defined by openings in, and are spaced apart from each other by, a material such as an insulator or conductor. Thus, pitch can be understood as the sum of the width of a feature and the width of the space separating that feature from a neighboring feature.

BRIEF SUMMARY OF THE INVENTION

In one embodiment of the present invention, a method for fabricating a semiconductor device comprises patterning a layer of photoresist material to form a plurality of mandrels in a device array region. The method further comprises depositing an oxide material over the plurality of mandrels and over a device peripheral region. The method further comprises anisotropically etching the oxide material from exposed horizontal surfaces in the device array region. The method further comprises forming a pattern of photoresist material over the oxide material in the device peripheral region. The method further comprises selectively etching photoresist material from the device array region and from the device peripheral region.

In another embodiment of the present invention, a method of forming a memory device comprises forming a plurality of mandrels over a substrate in an array region of the memory device. The mandrels optionally comprise a photoresist material. The mandrels are separated by exposed portions the substrate. The method further comprises depositing a spacer material over the mandrels, over the exposed portions of the substrate, and over a peripheral region of the memory device. The method further comprises depositing a peripheral mask over the spacer material in the peripheral region of the memory device. The method further comprises anisotropically etching the spacer material from exposed horizontal surfaces. Spacer material is left remaining (a) on vertical sidewalls of the mandrels in the array region, and (b) between the substrate and the peripheral mask in the peripheral region.

In another embodiment of the present invention, a method of forming an integrated circuit comprises forming a plurality of mandrels on a hard mask layer in an array region. The mandrels comprise a photoresist material. The method further comprises depositing an oxide material over the array region and over a peripheral region that surrounds the array region. The oxide material covers the plurality of mandrels. The method further comprises forming a pattern of photoresist material over the oxide material in the peripheral region. The method further comprises anisotropically etching the oxide material from horizontal surfaces in the array region. The method further comprises removing exposed photoresist material from the array region and the peripheral region after anisotropically etching the oxide material.

In another embodiment of the present invention, a method of integrated circuit fabrication comprises using a lithographic technique to define a plurality of elongate mandrels over a hard mask layer in an integrated circuit array region. The mandrels comprise a photoresist material. The method further comprises forming a pattern of spacers around the plurality of elongate mandrels. The pattern of spacers have a pitch that is smaller than a minimum resolvable pitch of the lithographic technique. The spacers are formed from an oxide material that is deposited at a temperature less than about 100° C.

In another embodiment of the present invention, a partially formed integrated circuit comprises a substrate. The partially formed integrated circuit further comprises a hard mask layer positioned over the substrate. The partially formed integrated circuit further comprises a plurality of spacer loops that are formed directly over the hard mask layer, and that are at least partially positioned in an array region of the partially formed integrated circuit. The partially formed integrated circuit further comprises a mask at least partially defined in a peripheral region of the partially formed integrated circuit, wherein the mask is also directly formed over the hard mask layer.

BRIEF DESCRIPTION OF THE DRAWINGS

Exemplary embodiments of the integrated circuits and integrated circuit fabrication techniques disclosed herein are illustrated in the accompanying drawings, which are for illustrative purposes only, and which are not necessarily drawn to scale. The drawings comprise the following figures, in which like numerals indicate like parts.

FIG. 3A is a schematic cross-sectional view of the example partially formed integrated circuit of FIG. 2A after forming lines in an array region in a photoresist layer.

DETAILED DESCRIPTION OF THE INVENTION

As the size of the electrical devices and the conductors that comprise a memory device are made smaller and smaller, ever greater demands are placed on the techniques used to form these features. For example, photolithography is commonly used to pattern device features, such as conductive lines, on a substrate. The concept of pitch can be used to describe the size of these features. Due to optical factors such as light or radiation wavelength, however, photolithography techniques have a minimum pitch below which features cannot be formed reliably. Thus, the minimum pitch of a photolithographic technique can limit feature size reduction.

Figure 1A:
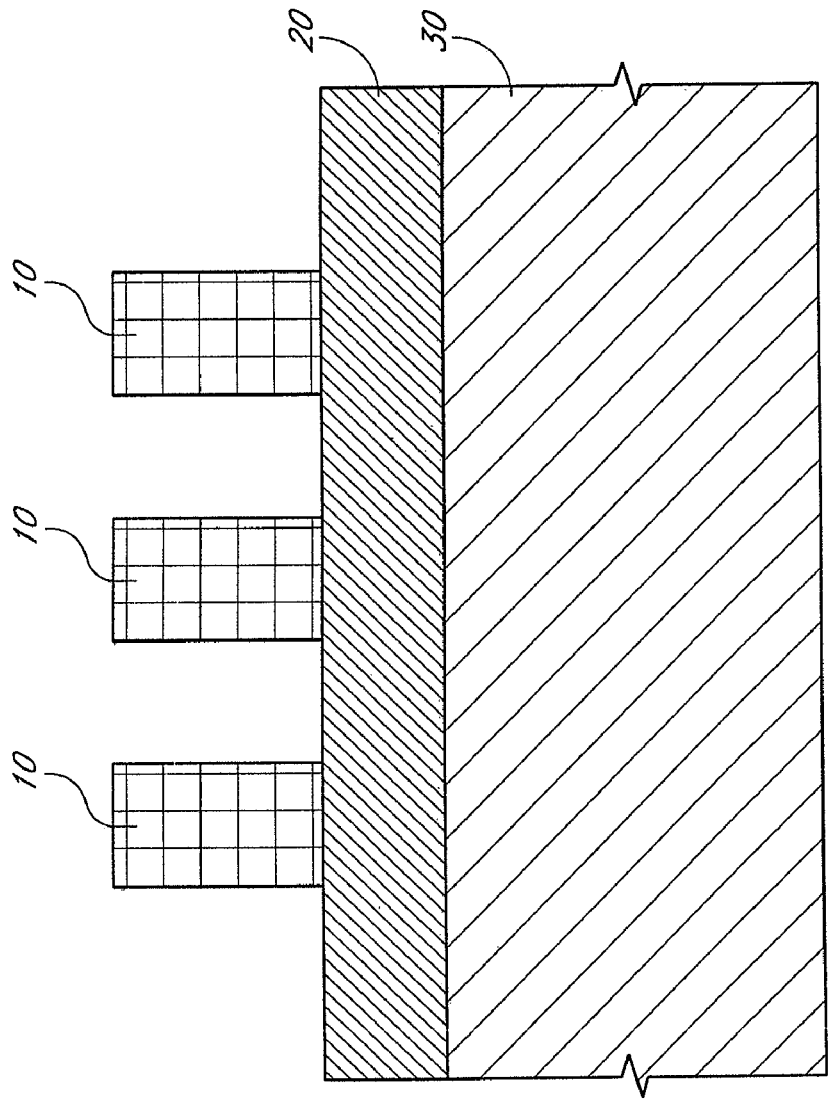
FIG. 1A is a schematic cross-sectional view of a substrate having a plurality of mask lines formed thereon.
Figure 1B:
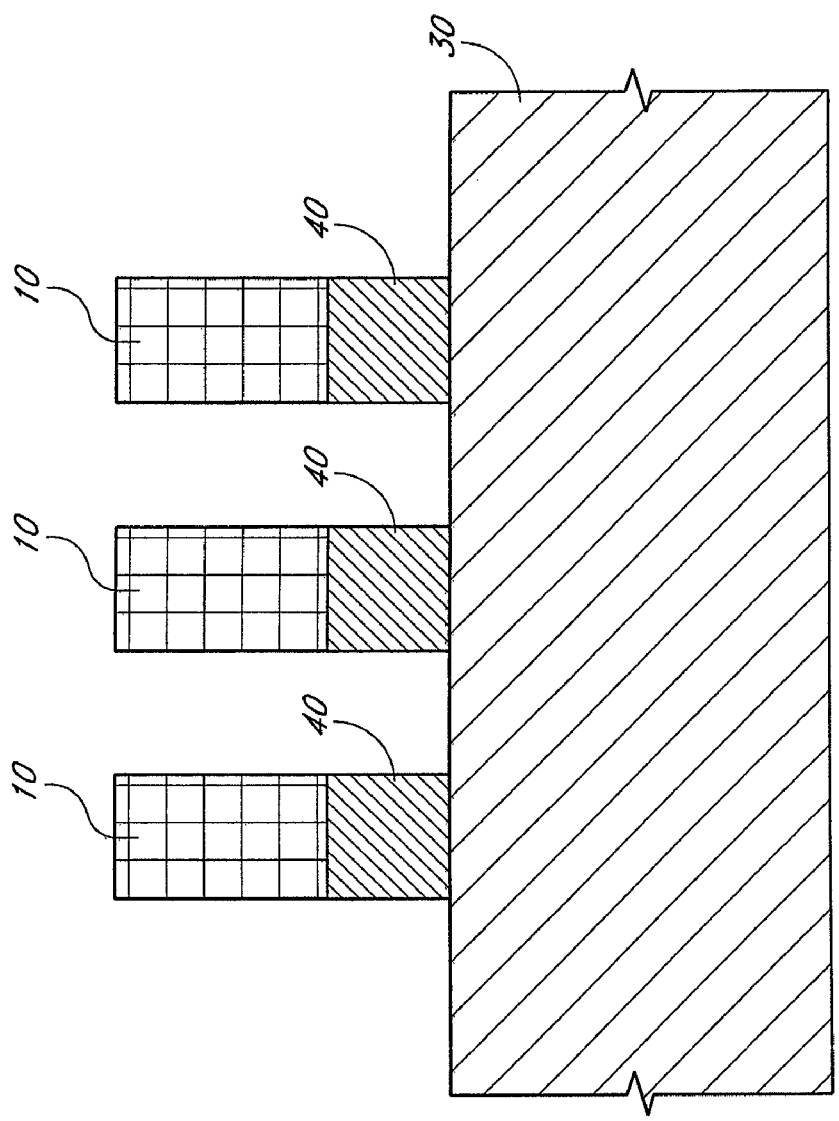
FIG. 1B is a schematic cross-sectional view of the substrate of FIG. 1A after performing an anisotropic etch process that transfers the mask pattern into a temporary layer.
Figure 1C:
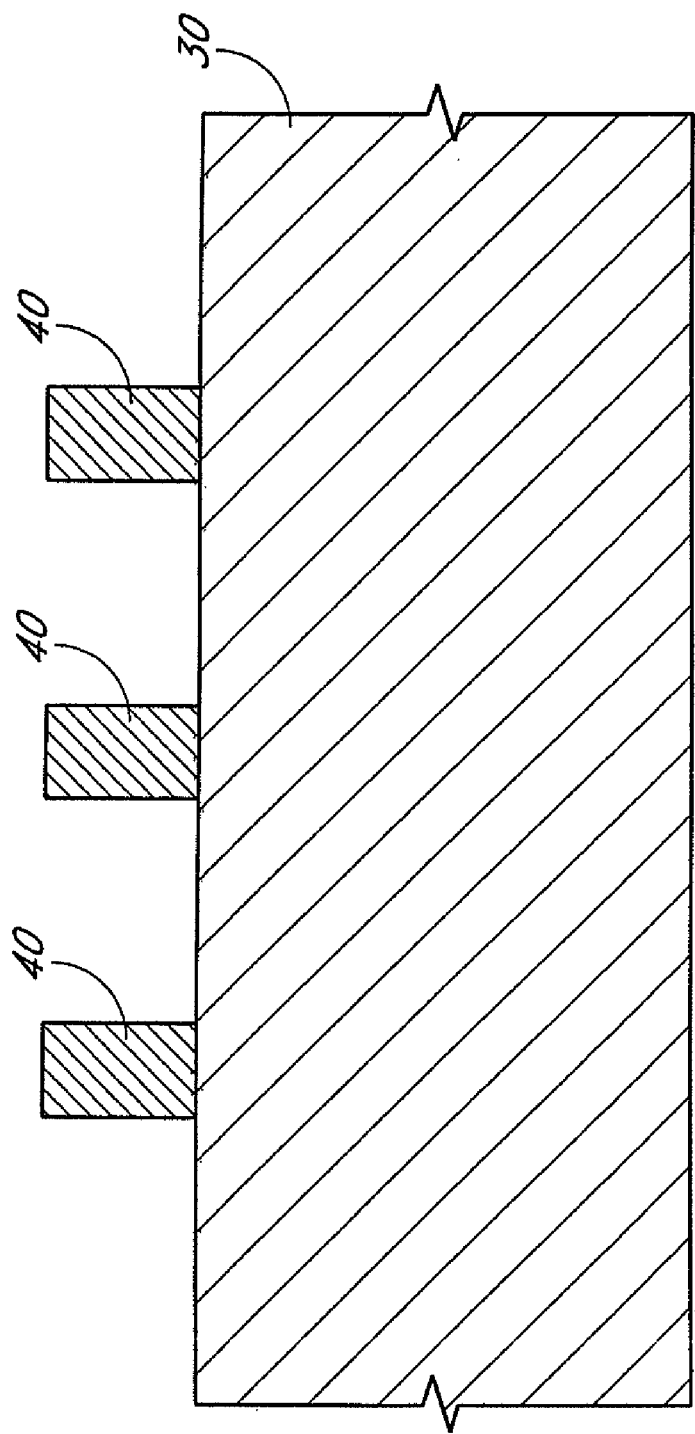
FIG. 1C is a schematic cross-sectional view of the substrate of FIG. 1B after removing the mask lines and performing an isotropic "shrink" etch.
Figure 1D:
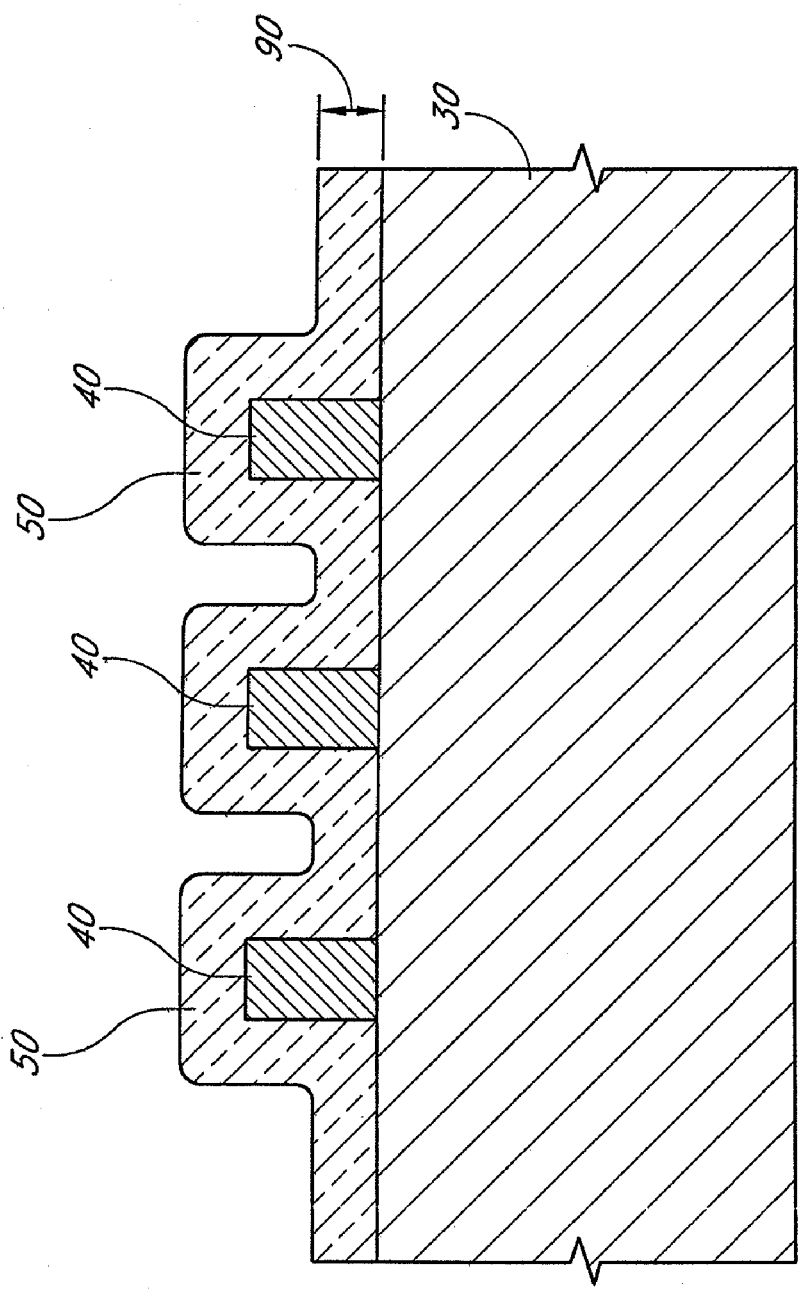
FIG. 1D is a schematic cross-sectional view of the substrate of FIG. 1C after blanket depositing a spacer material over mandrels left in the temporary layer.
Figure 1E:
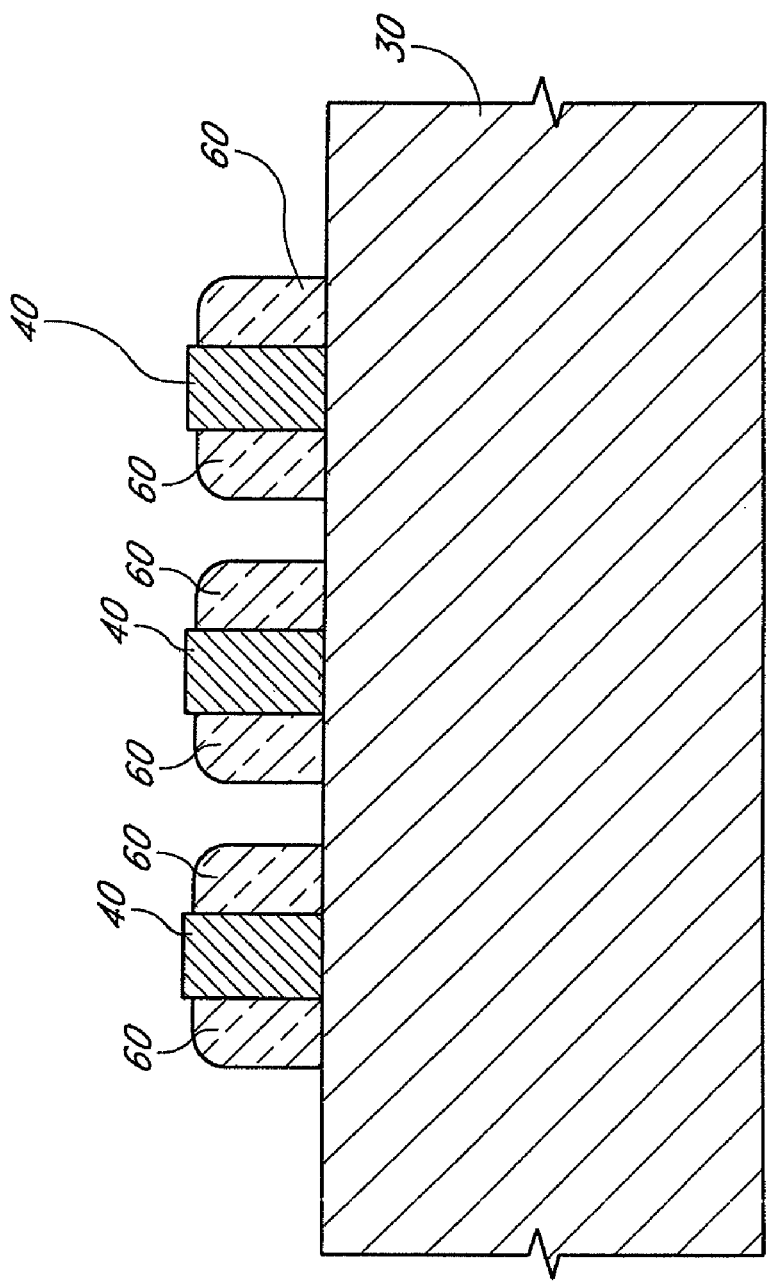
FIG. 1E is a schematic cross-sectional view of the substrate of FIG. 1D after performing a directional spacer etch to leave pitch-multiplied features or spacers.
Figure 1F:
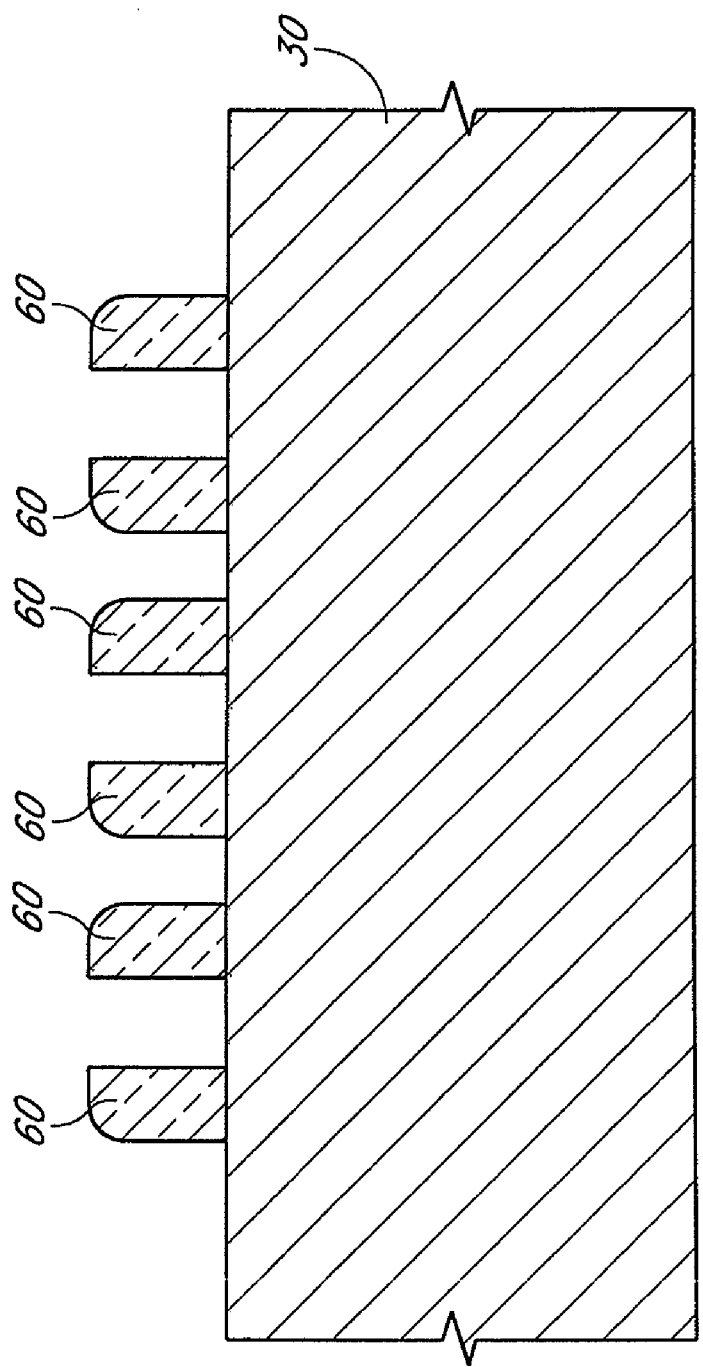
FIG. 1F is a schematic cross-sectional view of the substrate of FIG. 1E after removing the mandrels.

One technique proposed for extending the capabilities of photolithographic techniques beyond their minimum pitch is the "pitch doubling" technique. This technique is illustrated in FIGS. 1A-1F, and is described in U.S. Pat. No. 5,328,810 (issued 12 Jul. 1994), the entire disclosure of which is incorporated herein by reference. With reference to FIG. 1A, photolithography is first used to form a pattern of lines 10 in a photoresist layer overlying a layer of a temporary or expendable material 20 and a substrate 30. Common wavelengths which are used in performing the photolithography include, but are not limited to, 157 nm, 193 nm, 248 nm or 365 nm. Before performing subsequent processing steps, the lines 10 are optionally shrunk using an isotropic etch. As shown in FIG. 1B, the pattern is then transferred by an etch step, such as an anisotropic etch step, to, the layer of expendable material 20, thereby forming placeholders or mandrels 40. The photoresist lines 10 can be stripped and the mandrels 40 can be isotropically etched to increase the distance between neighboring mandrels 40, as shown in FIG. 1C. A layer of spacer material 50 is subsequently deposited over the mandrels 40, as shown in FIG. 1D. Spacers 60 are then formed on the sides of the mandrels 40 by preferentially etching the spacer material from the horizontal surfaces in a directional spacer etch, as shown in FIG. 1E. The remaining mandrels 40 are then removed, leaving behind only the spacers 60, which together act as a mask for patterning, as shown in FIG. 1F. Thus, where a given pattern area formerly defined one feature and one space (each having a width F, for a pitch of 2 F), the same pattern area now includes two features and two spaces, as defined by spacers 60 (each having a width ½ F, for a pitch of F). Consequently, the smallest feature size possible with a photolithographic technique is effectively decreased by using the pitch doubling technique.

While pitch is actually reduced using these techniques, this reduction in pitch is conventionally referred to as "pitch doubling", or more generally, "pitch multiplication". This is because these techniques allow the number of features in a given region of the substrate to be doubled, or more generally, multiplied. Thus, using the conventional terminology, "multiplication" of pitch by a certain factor actually involves reducing the pitch by that factor. The conventional terminology is retained herein. By forming multiple layers of spacers upon each other, the definable feature size can be made even smaller. Thus, the terms "pitch multiplication" and "pitch doubling" refer to the process generally, regardless of the number of times the spacer formation process is employed.

Some proposed methods for forming patterns in the periphery and in the array of a memory device involve use of two separate carbon layers. For example, in one such method, the mandrels used to define spacer loops are formed in an upper carbon layer. After pitch doubling and periphery patterning processes are performed, the array pattern is transferred to a lower carbon layer. While this process does allow features of different sizes to be formed in the array and periphery regions, use of a low temperature oxide material to define the spacer loops allows mandrels to be formed from the existing photoresist layer. This advantageously allows the top carbon layer to be omitted, thereby simplifying production.

In accordance with the foregoing, simplified and improved techniques have been developed for forming arrays of features in different regions of a memory device.

In certain embodiments, the feature pattern to be transferred to a substrate has a pitch below the minimum pitch of the photolithographic technique used for processing the substrate. Additionally, certain embodiments can be used to form arrays of features, including logic or gate arrays and volatile and non-volatile memory devices such as DRAM, phase change memory ("PCM"), programmable conductor random access memory ("PCRAM"), read only memory ("ROM"), flash memory. In such devices, pitch multiplication is usable to form, for example, transistor gate electrodes and conductive lines in the array region of the devices. Optionally, conventional photolithography is usable to form larger features, such as local interconnects and complementary metal oxide semiconductor ("CMOS") circuits, in the peripheral region of the devices. For example, the logic array can be a field programmable gate array ("FPGA") having a core array similar to a memory array and a periphery with supporting logic circuits. Exemplary masking steps in the course of fabricating a memory device are illustrated in the figures and are described herein.

Figure 2A:
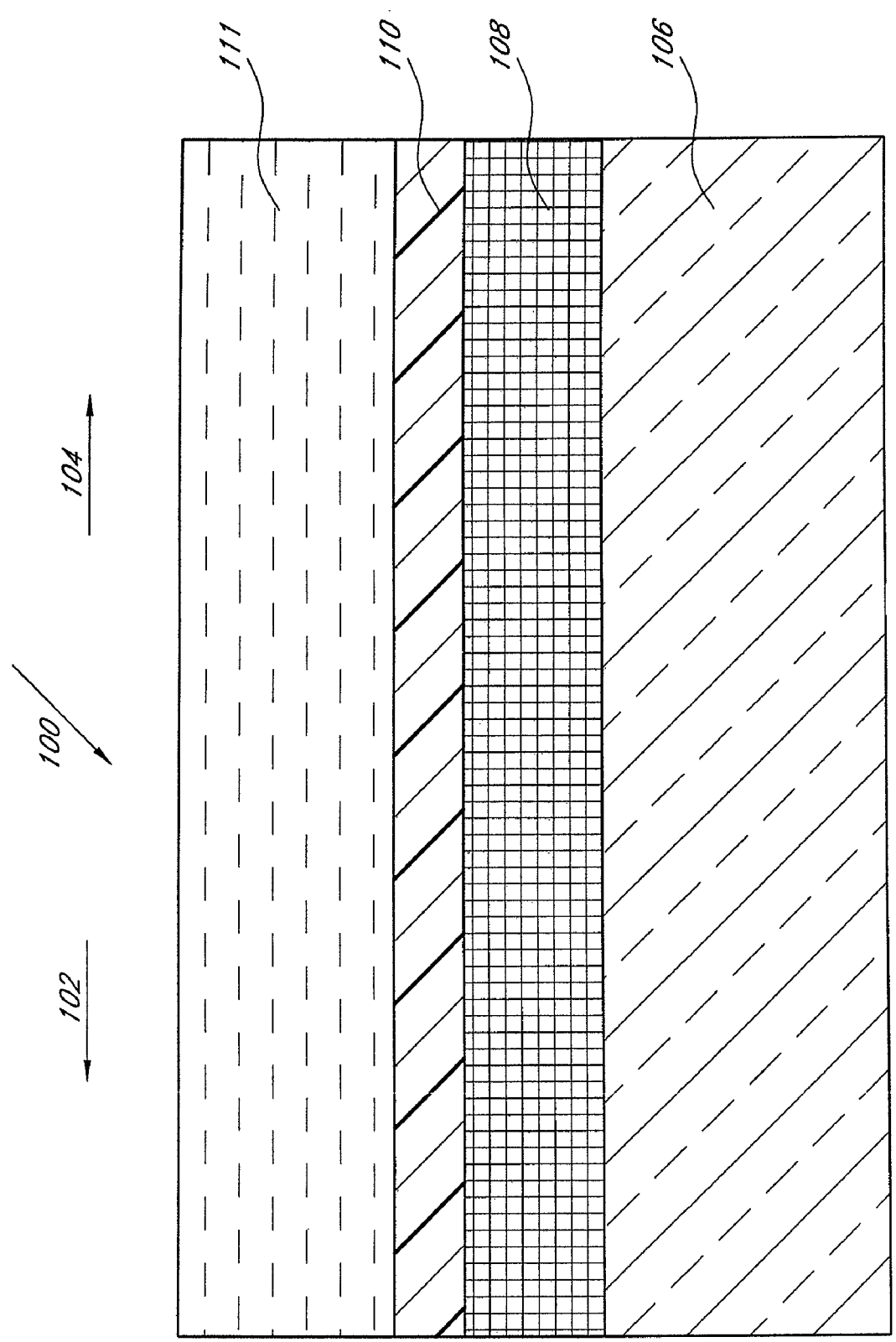
FIG. 2A is a schematic cross-sectional view of an example partially formed integrated circuit.
Figure 2B:
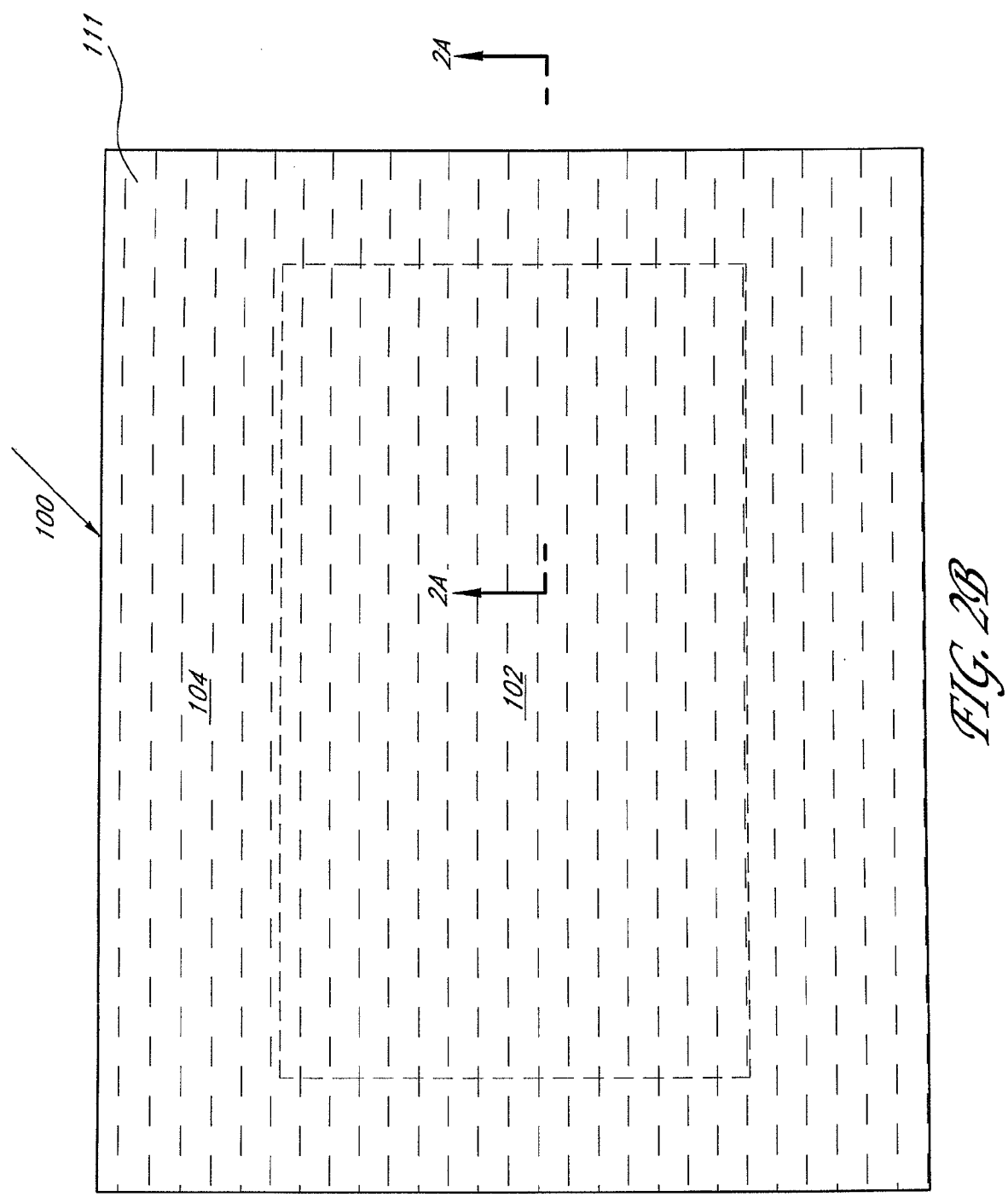
FIG. 2B is a schematic top view of the partially formed integrated circuit of FIG. 2A.

FIGS. 2A and 2B illustrate schematic cross-sectional and top views, respectively, of an example partially fabricated integrated circuit 100, such as a memory device. FIG. 2B illustrates that the integrated circuit 100 comprises a central array region 102 that is surrounded by a peripheral region 104. It will be appreciated that, after the integrated circuit 100 is fabricated, the array region 102 will typically be densely populated with conducting lines and electrical devices such as transistors and capacitors. Pitch multiplication can be used to form features in the array region 102, as discussed herein.

On the other hand, the peripheral region 104 optionally includes features larger than those in the array region 102. Conventional photolithography, rather than pitch multiplication, is typically used to pattern these larger features, examples of which include various types of logic circuitry. The geometric complexity of the logic circuits located in the peripheral region 104 makes using pitch multiplication difficult in this region of the integrated circuit 100. In contrast, the regular grid typical of array patterns is conducive to pitch multiplication. Additionally, some devices in the peripheral region 104 may require larger geometries due to electrical constraints, thereby making pitch multiplication less advantageous than conventional photolithography for such devices. In addition to possible differences in relative scale, the relative positions, and the number of peripheral regions 104 and array regions 102 in the integrated circuit 100 can vary in other embodiments. In embodiments wherein different processing techniques are separately used to form features in the array region 102 and the peripheral region 104, the peripheral region 104 can be masked during processing of the array region.

FIG. 2A illustrates that the partially formed integrated circuit 100 includes a substrate 106 having a first hard mask layer 108 formed thereover. In an example embodiment, the first hard mask layer 108 comprises a material such as silicon nitride, silicon oxide, or an organic material, such as an amorphous carbon material, a polymer material, or a spin on dielectric material. In a preferred embodiment, the first hard mask layer 108 comprises a form of amorphous carbon that is highly transparent to light and that offers further improvements for photo alignment by being transparent to the wavelengths of light used for such alignment. In other modified embodiments, the first hard mask layer 108 is omitted.

An optional second hard mask layer 110 is formed over the first hard mask layer 108. The second hard mask layer 110 preferably comprises an inorganic material. Example materials for the second hard mask layer 110 include silicon nitride, polycrystalline silicon, or a dielectric antireflective coating ("DARC"), such as silicon-rich silicon oxynitride. Preferably, the material comprising the second hard mask layer 110 can be selectively etched with respect to subsequently-deposited spacer materials. Use of a DARC for the second hard mask layer 110 can be particularly advantageous for forming patterns having pitches near the resolution limits of a photolithographic technique. In particular, a DARC can enhance resolution by reducing light reflections, thus increasing the precision with which photolithography can define the edges of a pattern. The second hard mask layer 110 is omitted in embodiments wherein the first hard mask layer 108 can be etched selectively with respect to subsequently deposited spacer materials. In still other embodiments, the second hard mask layer 110 is replaced with an organic spin on antireflective coating ("ARC") positioned between the first hard mask layer 108 and the subsequently described overlying array photoresist layer.

An array photoresist layer 111, also referred to herein as a mandrel layer, is formed over the second hard mask layer 110. The array photoresist layer 111 preferably comprises a photoresist material that is compatible with 157 nm, 193 nm, 248 nm or 365 nm wavelength systems, 193 nm wavelength immersion systems, extreme ultraviolet systems such as 13.7 nm wavelength systems, or electron beam lithographic systems. Examples of preferred photoresist materials include argon fluoride sensitive photoresist (that is, photoresist suitable for use with an argon fluoride light source) and krypton fluoride sensitive photoresist (that is, photoresist suitable for use with a krypton fluoride light source). Argon fluoride photoresists are preferably used with shorter wavelength photolithography systems, such as 193 nm wavelength systems. Krypton fluoride photoresists are preferably used with longer wavelength photolithography systems, such as 248 nm wavelength systems. In a modified embodiment, the array photoresist layer 111 comprises a photoresist material that can be patterned by nano-imprint lithography, such as by using a mold or a mechanical force to pattern the photoresist material.

In general, the materials for the first hard mask layer 108, the second hard mask layer 110, and the array photoresist layer 111 are chosen based on the chemistry and the process conditions for the various pattern forming and transfer steps disclosed herein. For instance, in an example embodiment, the first hard mask layer 108, the second hard mask layer 110, and the array photoresist layer 111 can each be selectively etched with respect to each other. As used herein, a material is considered "selectively etched" (or "preferentially etched") when the etch rate for that material is at least about 2 times greater, preferably at least about 10 times greater, more preferably at least about 20 times greater, and most preferably at least about 40 times greater than that for a neighboring material. In modified embodiments other layers are added if suitable other materials, chemistries and/or processes conditions are used.

The first hard mask layer 108, the second hard mask layer 110, and the array photoresist layer 111 can be formed using deposition processes such as spin-on coating, sputtering, chemical vapor deposition ("CVD"), or atomic layer deposition. For example, a low temperature CVD process (preferably less than about 550° C., more preferably less than about 450° C., and most preferably less than about 400° C.) advantageously reduces chemical and/or physical disruption of an amorphous carbon layer, and thus is useful for deposition of materials over an existing amorphous carbon layer, such as the first hard mask layer 108. Additional information regarding the formation of amorphous carbon layers, including doped amorphous carbon layers, is provided in U.S. Pat. No. 6,573,030 (issued 3 Jun. 2003) and U.S. Patent Application Publication 2005/0042879 (published 24 Feb. 2005). The entire disclosure of this patent and patent application publication is hereby incorporated by reference herein.

The thicknesses of the first hard mask layer 108, the second hard mask layer 110, and the array photoresist layer 111 are also chosen depending upon compatibility with the etch chemistries and process conditions disclosed herein. For example, when etching a material through a mask of another material, such as when transferring a pattern from an overlying layer to an underlying layer by selectively etching the underlying layer, materials from both layers are removed to some degree. Thus, the upper layer is preferably sufficiently thick such that it is not completely worn away over the course of the pattern transfer. In an example embodiment, the second hard mask layer 110 is preferably between about 10 nm and about 40 nm thick, and is more preferably between about 15 nm and about 30 nm thick.

The thickness of the array photoresist layer 111 depends on the wavelength of light used to pattern the array photoresist layer 111. In an example embodiment wherein 248 nm light is used to perform photolithography, the array photoresist layer 111 is preferably between about 50 nm and about 300 nm thick, and is more preferably between about 200 nm and 250 nm thick. This height can vary depending upon the wavelength of light used to pattern the photoresist layer. Because lines are subsequently formed in the array photoresist layer 111, in certain embodiments the height of the array photoresist layer 111 is limited by the structural integrity and the aspect ratio of the lines to be formed, since tall spacer lines may collapse or otherwise deform.

Figure 3B:
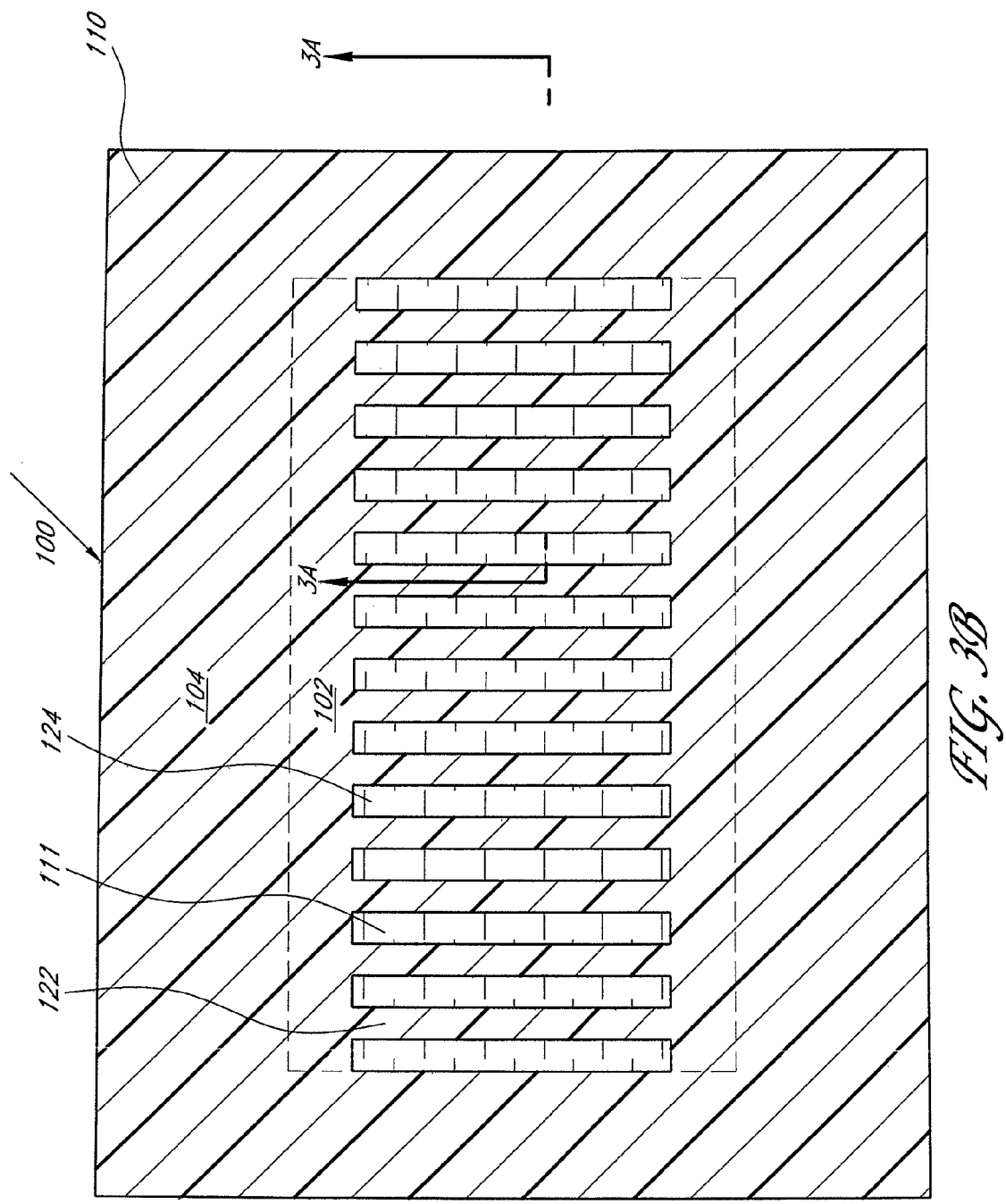
FIG. 3B is a schematic top view of the partially formed integrated circuit of FIG. 3A.

As illustrated in FIGS. 3A and 3B, a pattern is defined in the array photoresist layer 111 that comprises trenches 122 delimited by lines 124. The trenches 122 can be formed by, for example, photolithography with 248 nm or 193 nm light, in which the array photoresist layer 111 is exposed to radiation through a reticle and then developed. After being developed, the remaining photodefinable material, which is photoresist in the illustrated embodiment, forms mask features such as the illustrated lines 124. In other embodiments, maskless lithography, or maskless photolithography can also be used to define the lines 124.

The pitch of the resulting lines 124 is equal to the sum of the width of a line 124 and the width of a neighboring trench 122. To reduce the dimensions of features formed using this pattern of lines 124 and trenches 122, the pitch can be at or near the limits of the photolithographic technique used to pattern the array photoresist layer 111. For example, for photolithography using 248 nm light, the pitch of the lines 124 is preferably between about 80 nm and about 150 nm, and is more preferably between about 90 nm and about 120 nm. Thus, in an example embodiment the pitch is the minimum pitch of the photolithographic technique and the subsequently-formed pitch multiplied spacer pattern advantageously has a pitch below the minimum pitch of the photolithographic technique. In alternative embodiments, because the margin of error for position and feature size typically increases as the limits of a photolithographic technique are approached, the lines 124 are formed having larger feature sizes, such as 200 nm, to reduce errors in the positions and sizes of the lines 124.

Figure 4A:
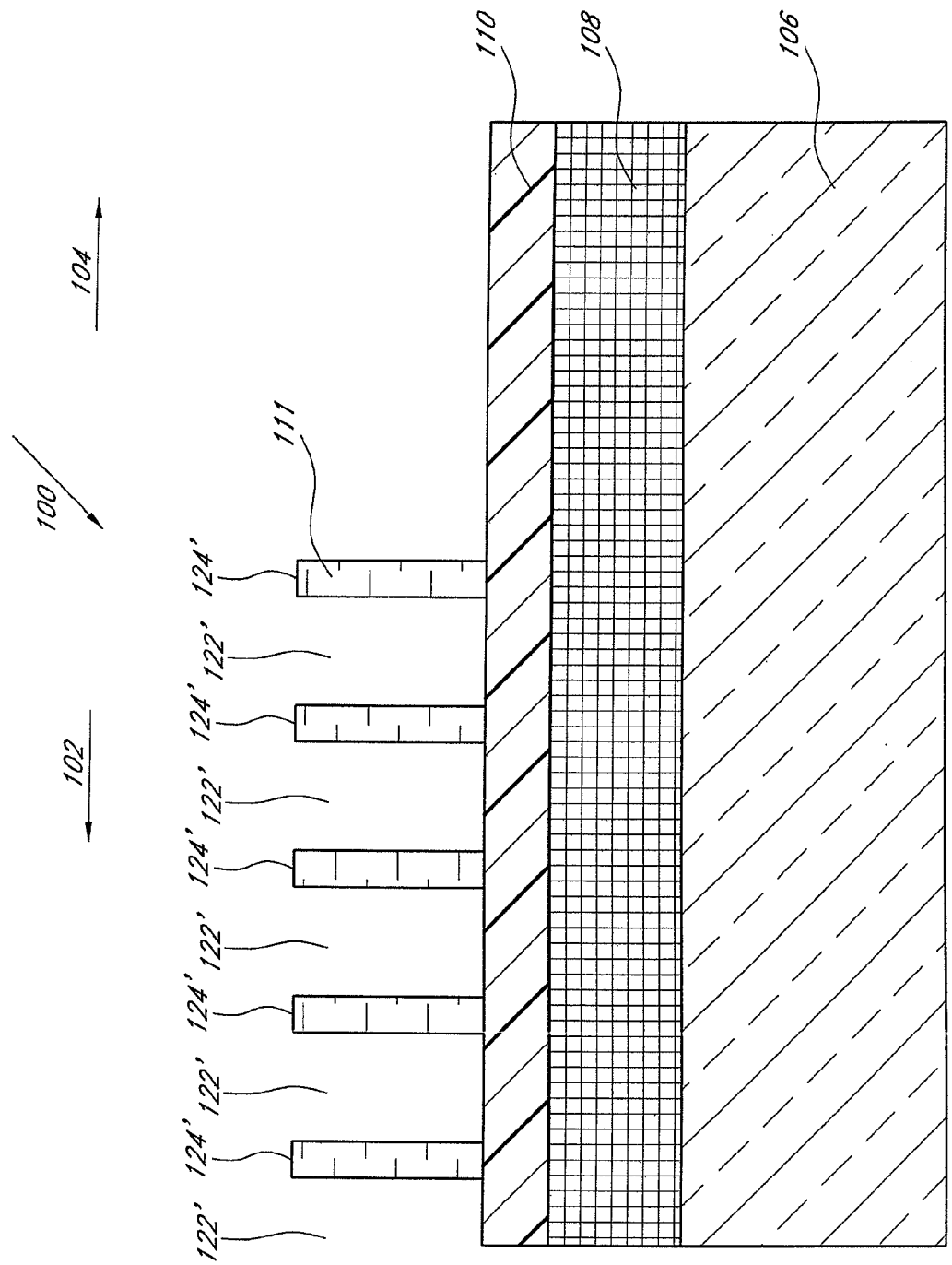
FIG. 4A is a schematic cross-sectional view of the example partially formed integrated circuit of FIG. 3A after performing an trim etch.
Figure 4B:
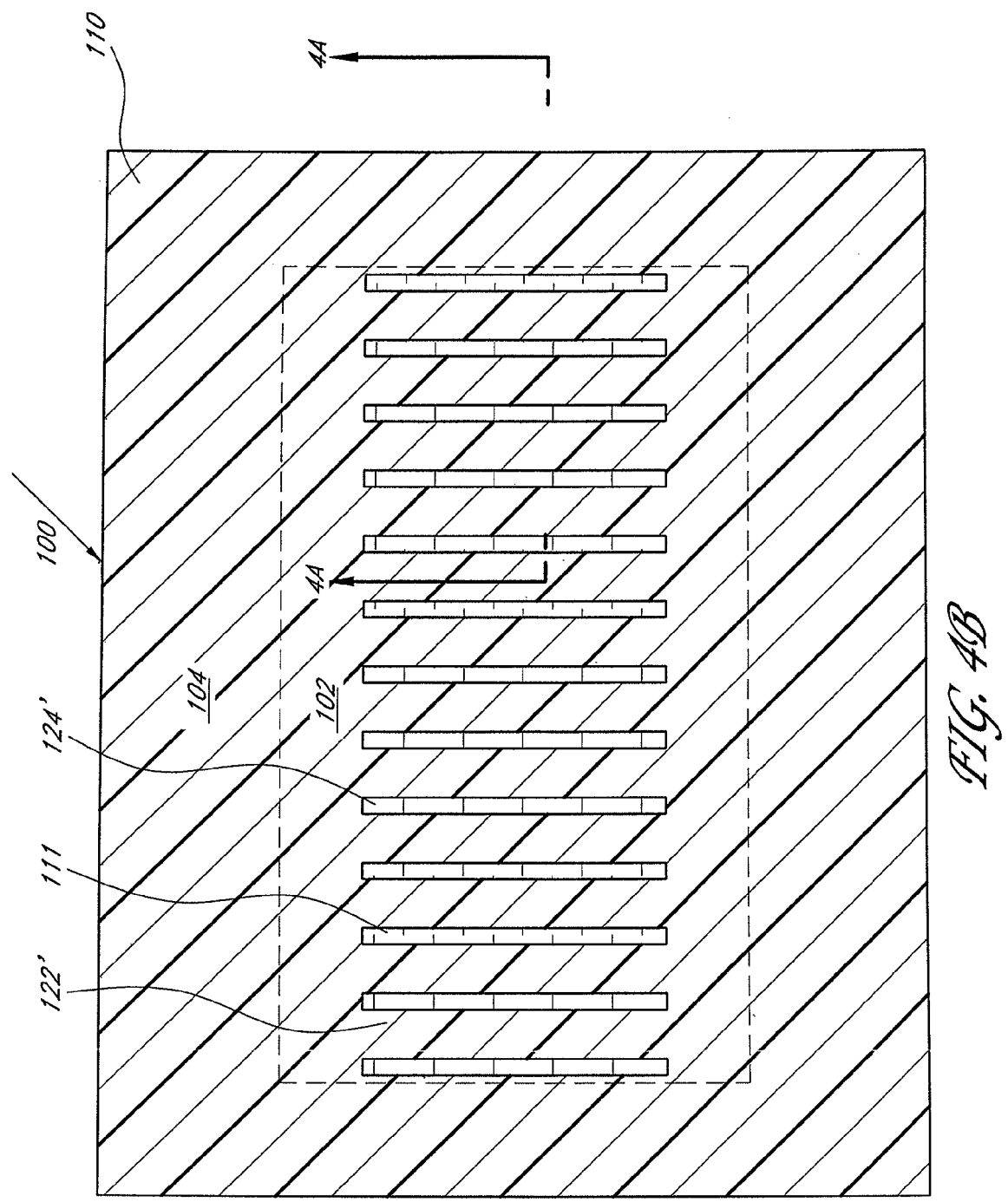
FIG. 4B is a schematic top view of the partially formed integrated circuit of FIG. 4A.

As illustrated in FIGS. 4A and 4B, the trenches 122 are preferably widened by etching the lines 124, to form modified trenches 122' and modified lines 124'. The lines 124 are preferably etched using a isotropic etch to "shrink" these features. Suitable etches include etches using an oxygen-containing plasma, such as a $SO_2/O_2/N_2/Ar$ plasma, a $Cl_2/O_2/He$ plasma, or a $HBr/O_2/N_2$ plasma. The extent of the etch is preferably selected so that the width of the modified lines 124' is substantially equal to the desired spacing between subsequently-formed pitch doubled features. For example, in an example embodiment the width of the lines 124 is reduced from between about 80 nm and about 120 nm to between about 35 nm and about 70 nm, and more preferably to between about 40 nm and about 50 nm. Advantageously, the width-reducing etch allows the modified lines 124' to be narrower than would otherwise be possible using the photolithographic technique used to form the lines 124. Additionally, the etch can provide the modified lines 124' with smoothed edges, thus improving the uniformity of the modified lines 124'. While the critical dimensions of the modified lines 124' can be etched below the resolution limits of the photolithographic technique, this etch does not alter the pitch of the modified trenches 122' and the modified lines 124', since the distance between identical points in these features remains the same.

Figure 5A:
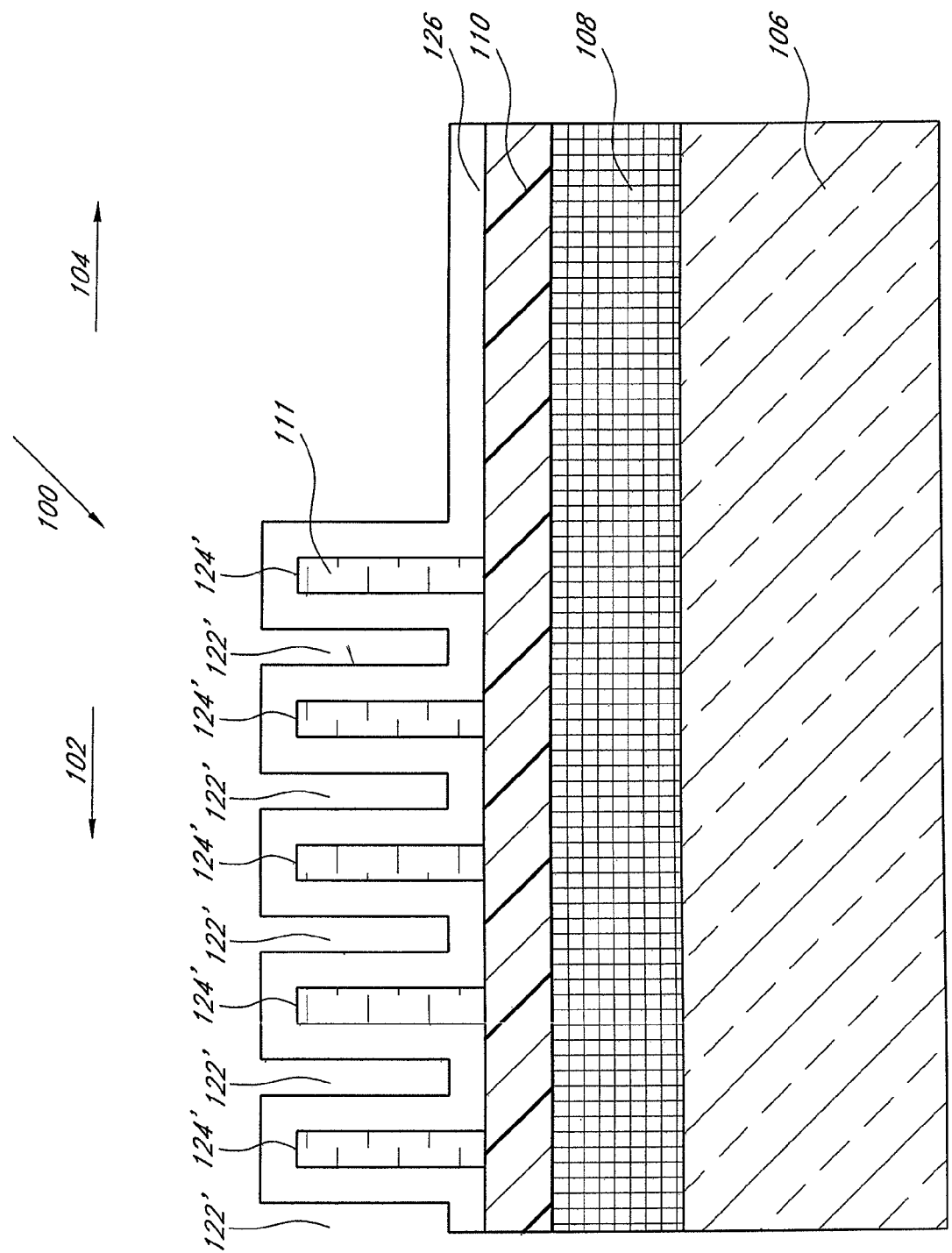
FIG. 5A is a schematic cross-sectional view of the example partially formed integrated circuit of FIG. 4A after blanket depositing a low temperature spacer material over photoresist mandrels.
Figure 5B:
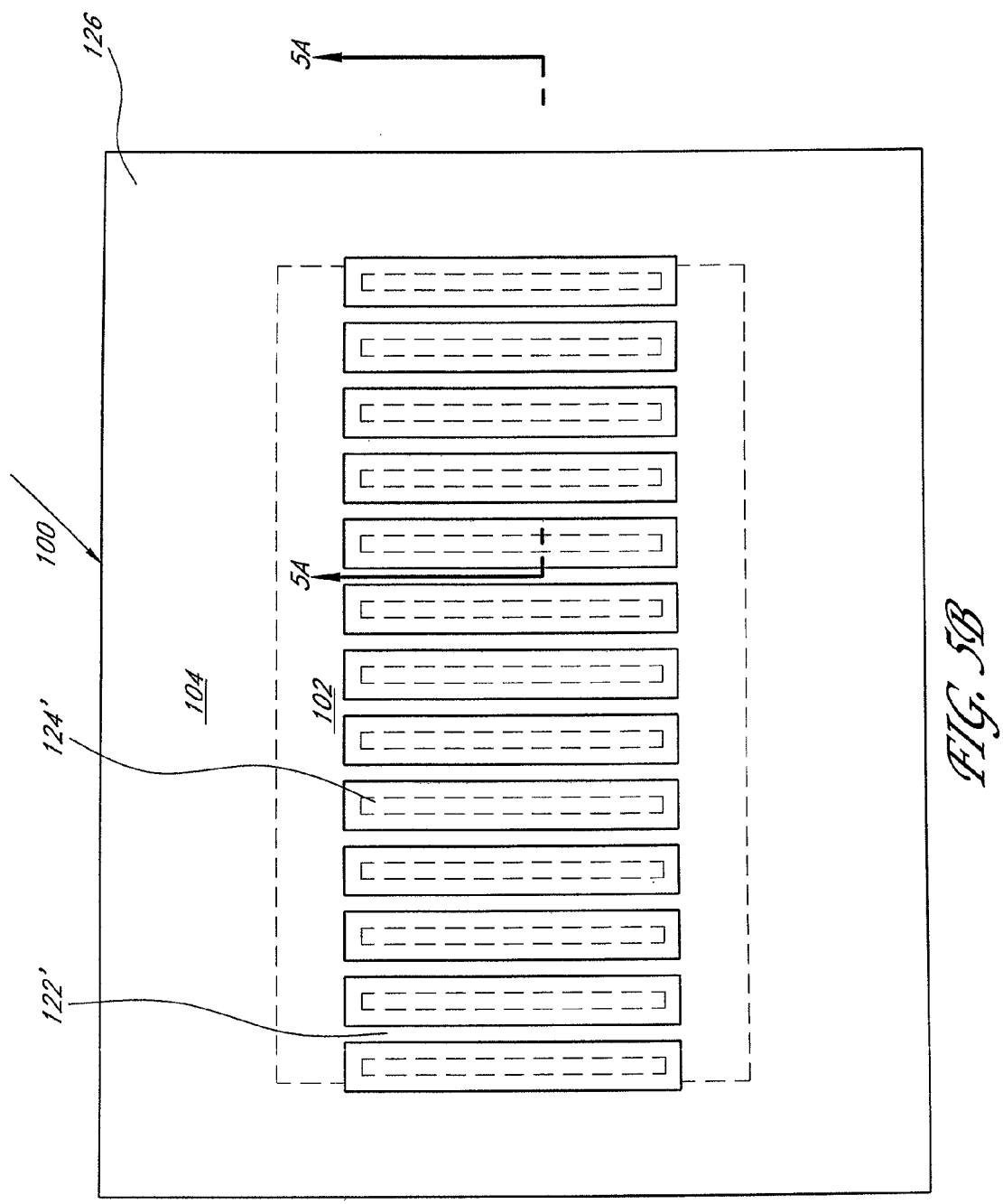
FIG. 5B is a schematic top view of the partially formed integrated circuit of FIG. 5A.

As illustrated in FIGS. 5A and 5B, a blanket layer of low temperature spacer material 126 is deposited over the modified lines 124'. In an example embodiment, the low temperature spacer material 126 comprises a layer of oxide material deposited using an atomic layer deposition ("ALD") technique. Generally, photoresist materials are not as tolerant of high temperatures as inorganic or carbon materials. Therefore, forming the spacers from a low temperature oxide material advantageously allows a separate mandrel layer deposition, pattern and transfer to be eliminated, with the patterned array photoresist layer 111 serving the same function. The low temperature spacer material is preferably deposited at less than about 200° C., more preferably at less than about 150° C., more preferably less than about 125° C., more preferably less than about 100° C., more preferably less than about 80° C., more preferably less than about 75° C., and most preferably at less than about 30° C.

In an example embodiment, the low temperature spacer material 126 is deposited in an ALD process using $Si_2Cl_6$, $H_2O$ and $C_5H_5N$ precursors. In such embodiments the spacer material 126 is deposited to a thickness that is preferably between about 20 nm and about 65 nm, more preferably between about 25 nm and about 60 nm, and most preferably between about 30 nm and about 55 nm. In one embodiment, the spacer material thickness is between about 30 nm and about 40 nm, and in another embodiment, the spacer material thickness is between about 43 nm and about 55 nm. The spacer material deposition rate is preferably between about 1 Å per cycle and about 4 Å per cycle, and more preferably about 2 Å per cycle.

Figure 6A:
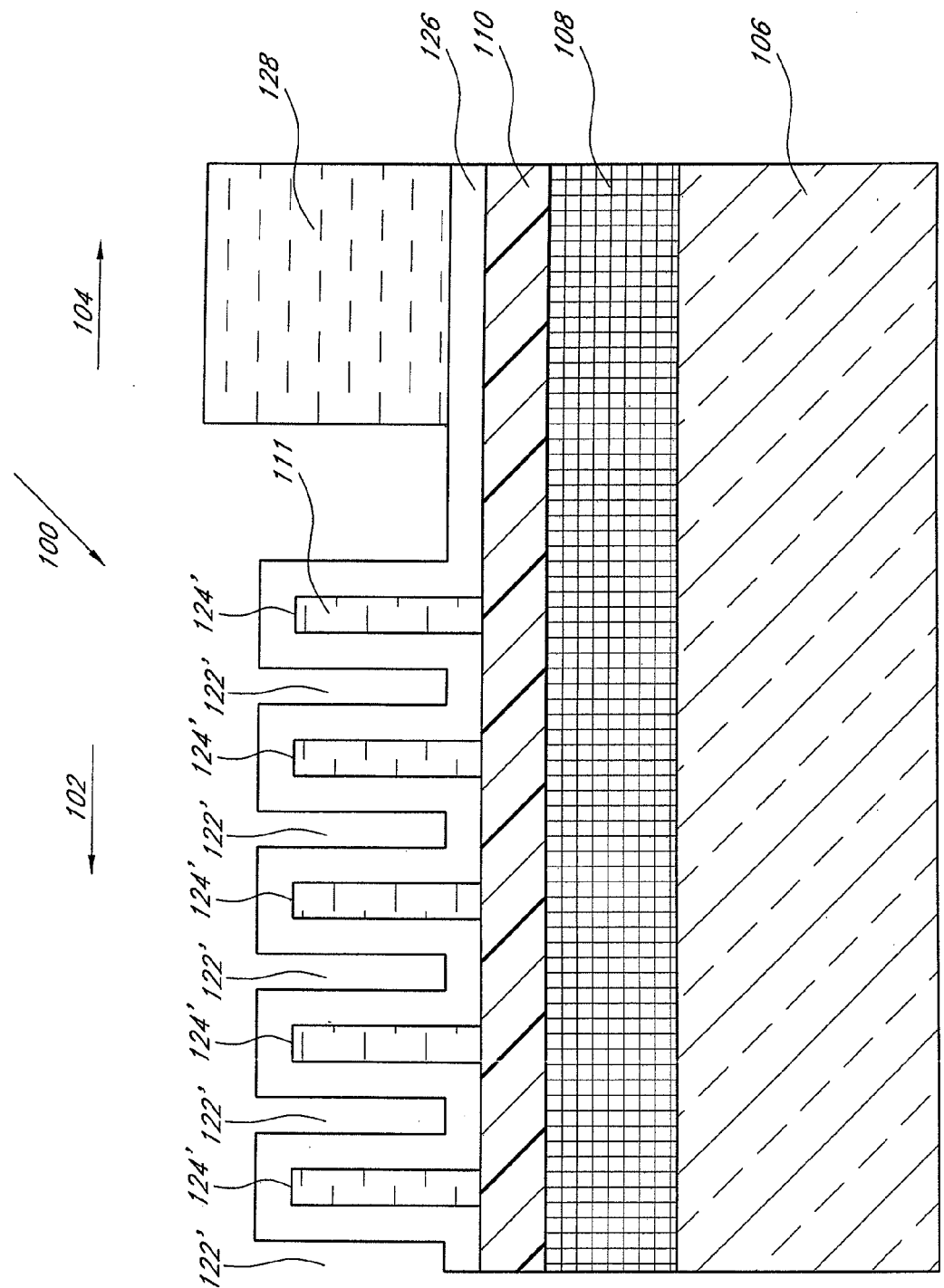
FIG. 6A is a schematic cross-sectional view of the example partially formed integrated circuit of FIG. 5A after defining features in the peripheral region.
Figure 6B:
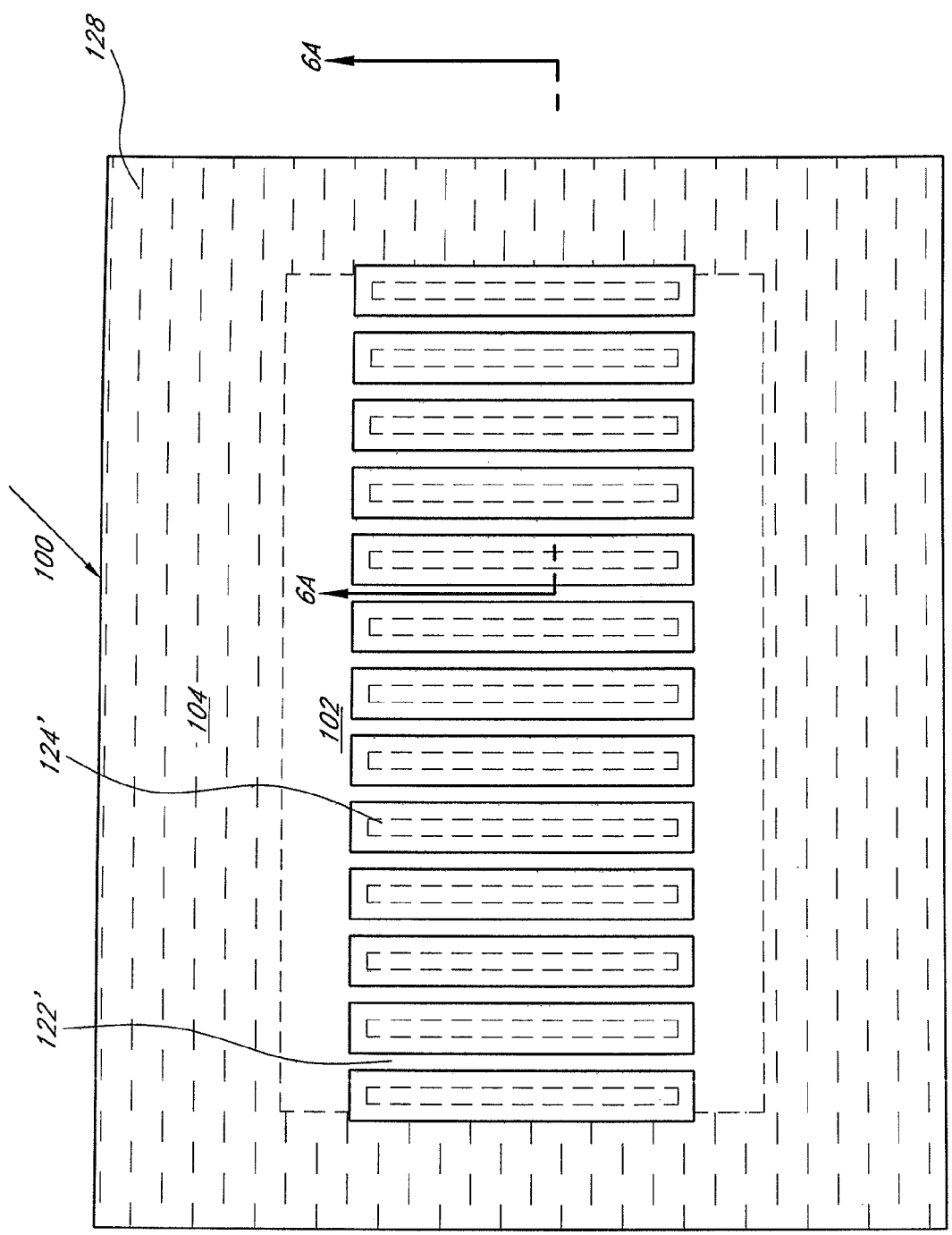
FIG. 6B is a schematic top view of the partially formed integrated circuit of FIG. 6A, wherein a periphery photoresist layer is blanket deposited over substantially the entire peripheral region.
Figure 6C:
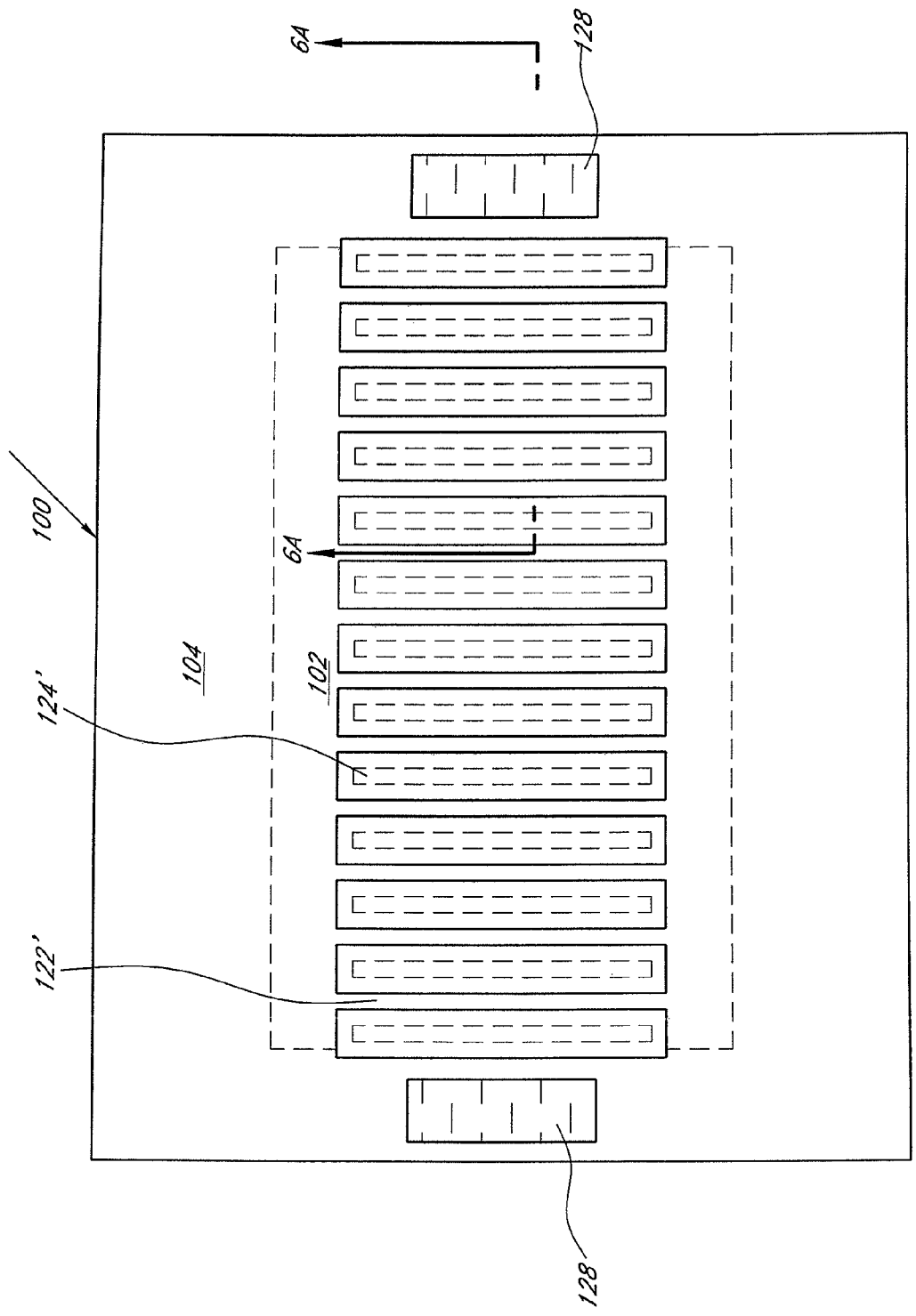
FIG. 6C is a schematic top view of the partially formed integrated circuit of FIG. 6A, wherein a periphery photoresist layer is patterned to define periphery features.
Figure 6D:
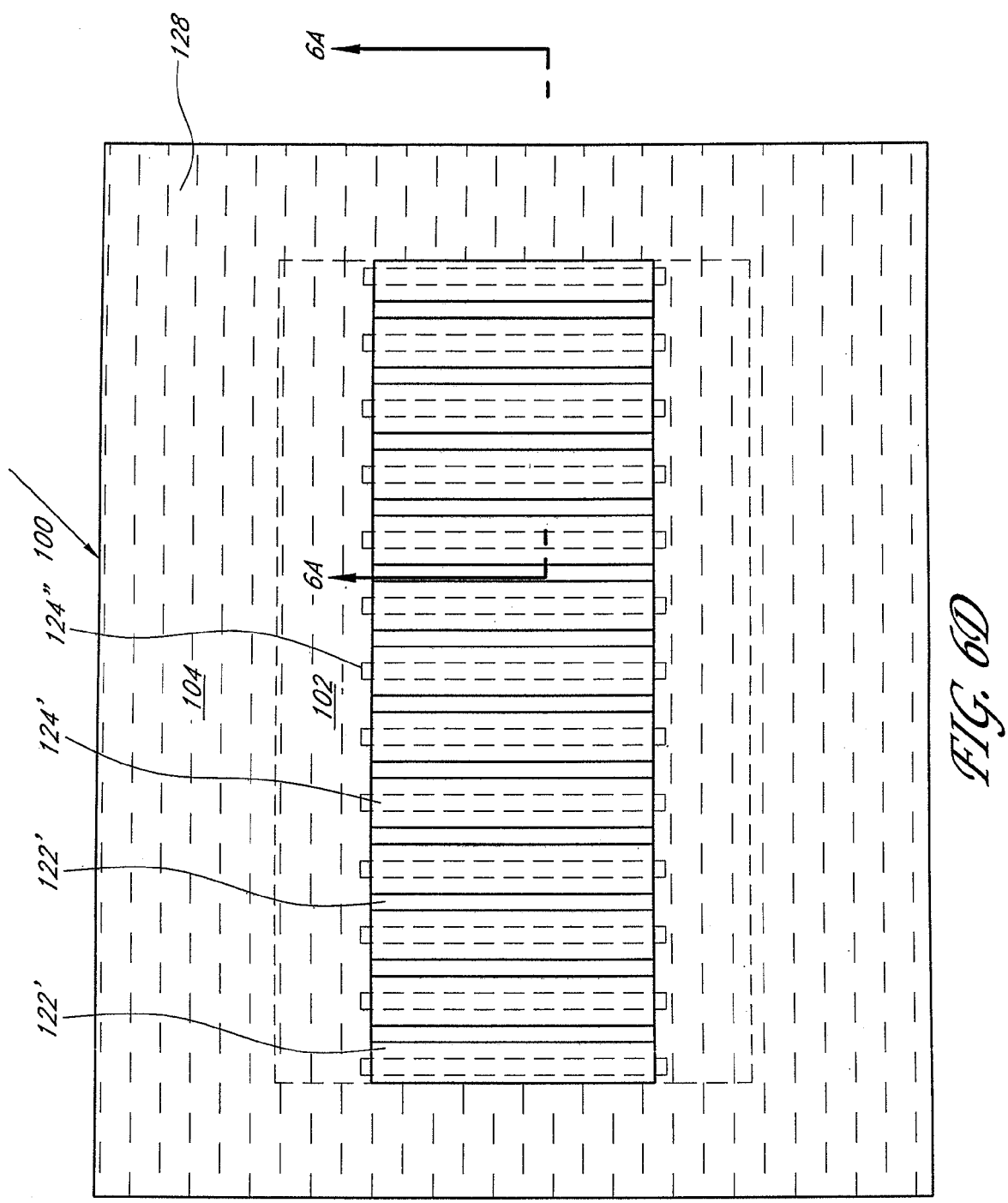
FIG. 6D is a schematic top view of the partially formed integrated circuit of FIG. 6A, wherein a periphery photoresist layer partially overlaps the low temperature spacer material.

As illustrated in FIGS. 6A through 6D, a periphery photoresist layer 128 is deposited in the peripheral region 104, while at least a portion of the array region 102 is left open. In a preferred embodiment, illustrated in FIG. 6B, the periphery photoresist layer 128 is blanket deposited over substantially the entire peripheral region 104. In an alternative embodiment, illustrated in FIG. 6C, the periphery photoresist layer 128 is patterned to define periphery features. Example periphery features include landing pads, transistors, local interconnects, and the like. In another alternative embodiment, illustrated in FIG. 6D, the periphery photoresist layer 128 is deposited over the looped ends of the low temperature spacer material 126 and the tips 124" of the modified lines 124', thereby blocking the tips 124" of the modified lines 124'. The embodiment illustrated in FIG. 6D is particularly advantageous for forming damascene structures because this configuration prevents the looped ends over the low temperature spacer material 126 from being operational during subsequent etching processes.

In modified embodiments, the periphery photoresist layer 128 is deposited in the same deposition step in which the array photoresist layer 111 is deposited. In such embodiments, the mask used to pattern the array photoresist layer 111 is configured so as to leave a photoresist pattern or blanket layer in the peripheral region 104. This process results in photoresist being deposited directly on the second hard mask layer 110 in the peripheral region 104, without the intervening spacer material 126.

Figure 7A:
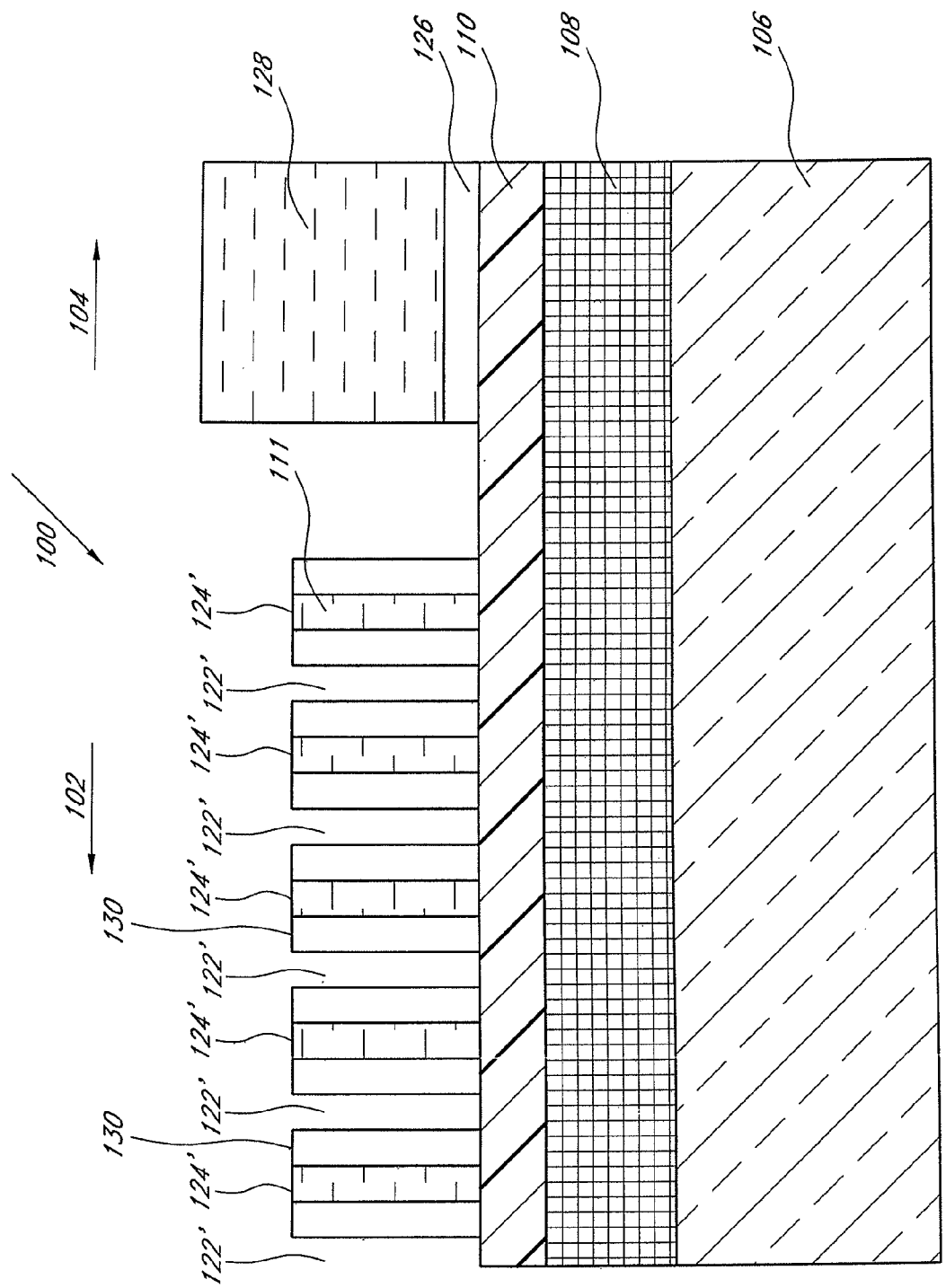
FIG. 7A is a schematic cross-sectional view of the example partially formed integrated circuit of FIG. 6A after performing an anisotropic etch of the low temperature spacer material.
Figure 7B:
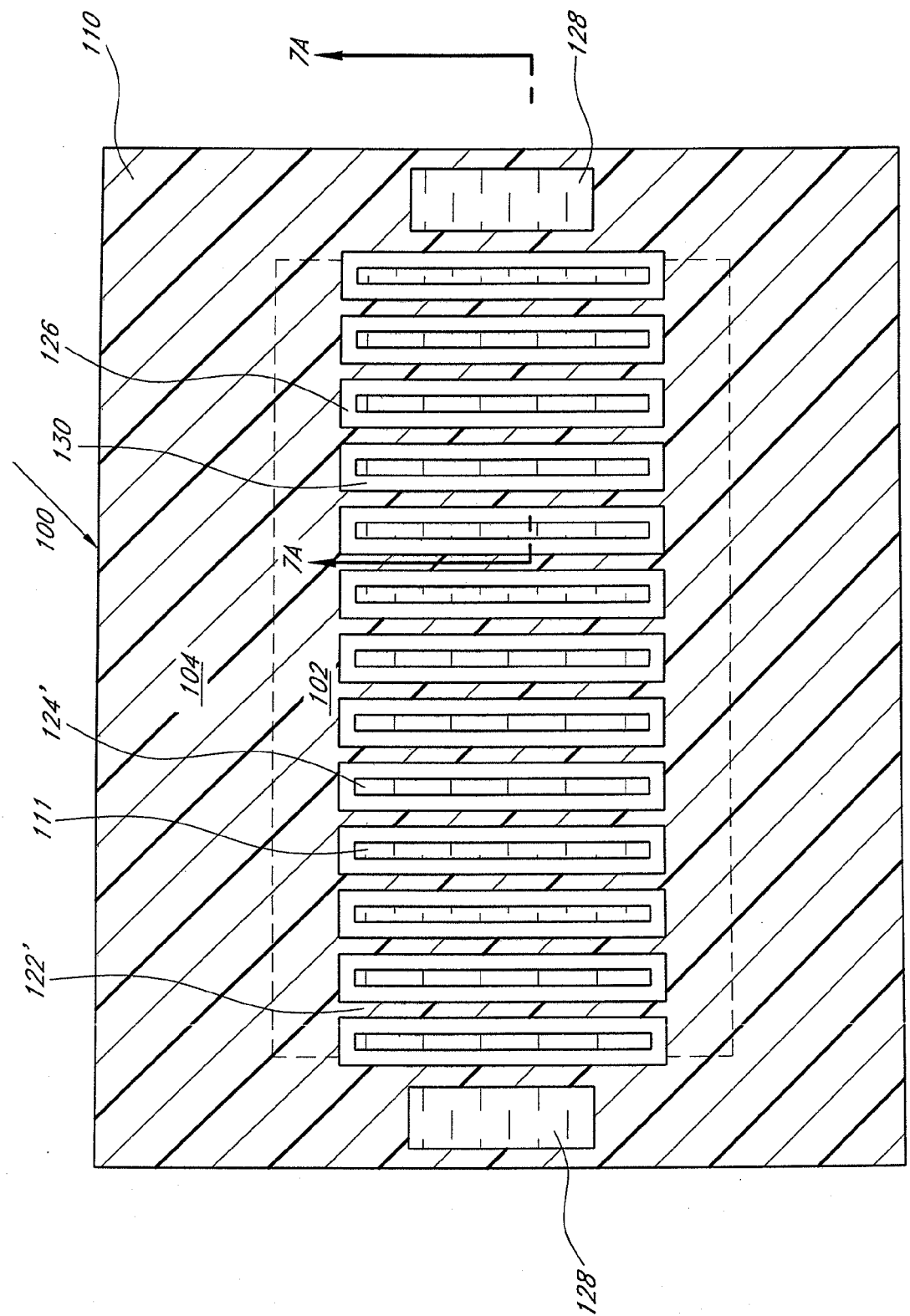
FIG. 7B is a schematic top view of the partially formed integrated circuit of FIG. 7A.

As illustrated in FIGS. 7A and 7B, the low temperature spacer material 126 is then subjected to an anisotropic etch to remove spacer material from horizontal surfaces of the partially formed integrated circuit 100. Such an etch, also known as a spacer etch, can be performed using, for example a $HBr/Cl_2$-containing plasma. Thus, pitch multiplication has been accomplished to form spacers 130. In the illustrated embodiment, the pitch of the spacers 130 is roughly half that of the photoresist lines 124 and trenches 122 (see FIGS. 3A and 3B) originally formed by photolithography. Where the photoresist lines 124 had a pitch of about 200 nm, spacers 130 having a pitch of about 100 nm or less (for a width of about 50 nm) can be formed. Because the spacers 130 are formed on the sidewalls of the modified lines 124', the spacers 130 generally follow the outline of the pattern of modified lines 124' in the array photoresist layer 111, and thus typically form a closed loop as illustrated in FIG. 7B.

Figure 8A:
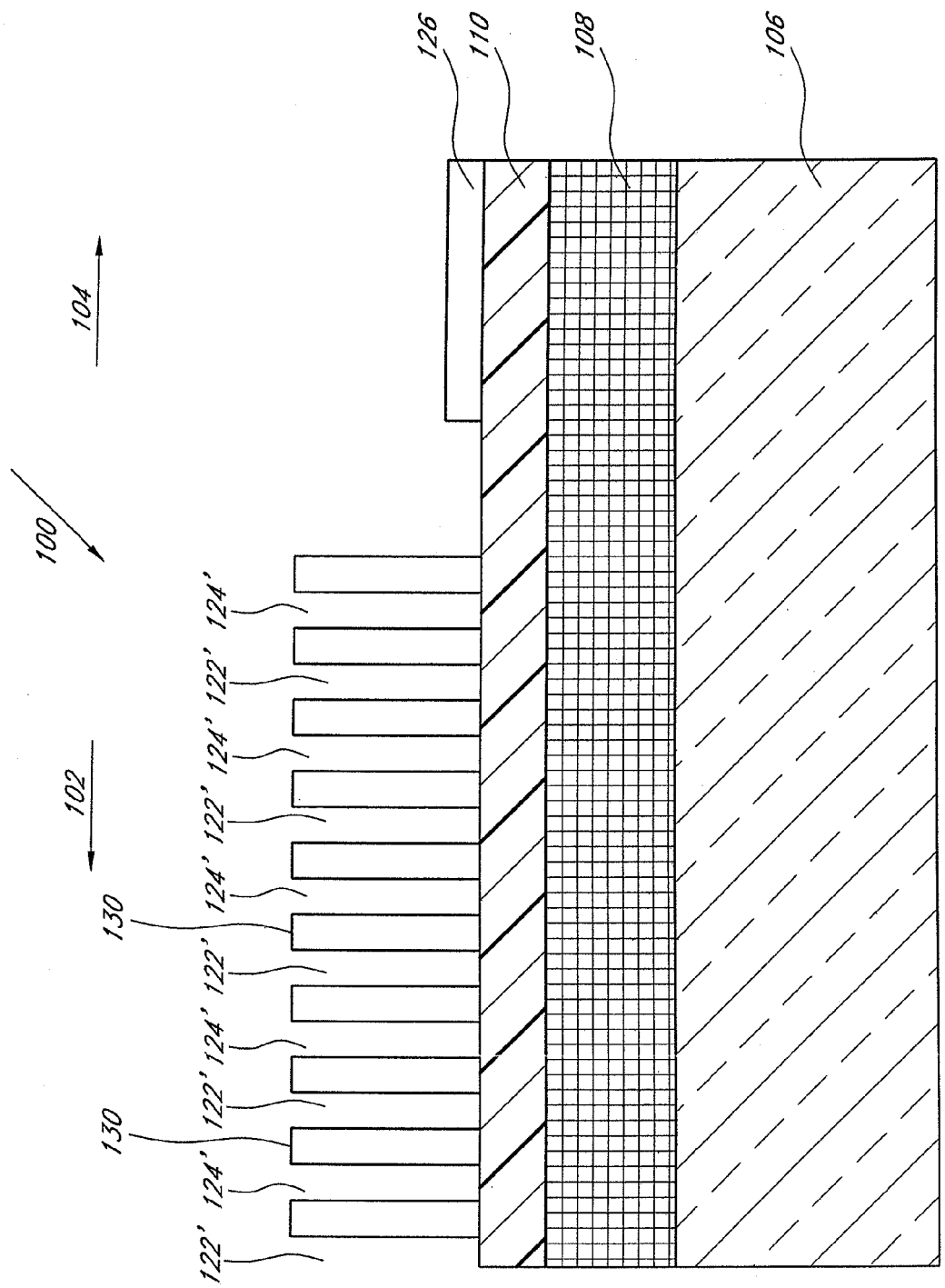
FIG. 8A is a schematic cross-sectional view of the example partially formed integrated circuit of FIG. 7A after removing exposed photoresist material.
Figure 8B:
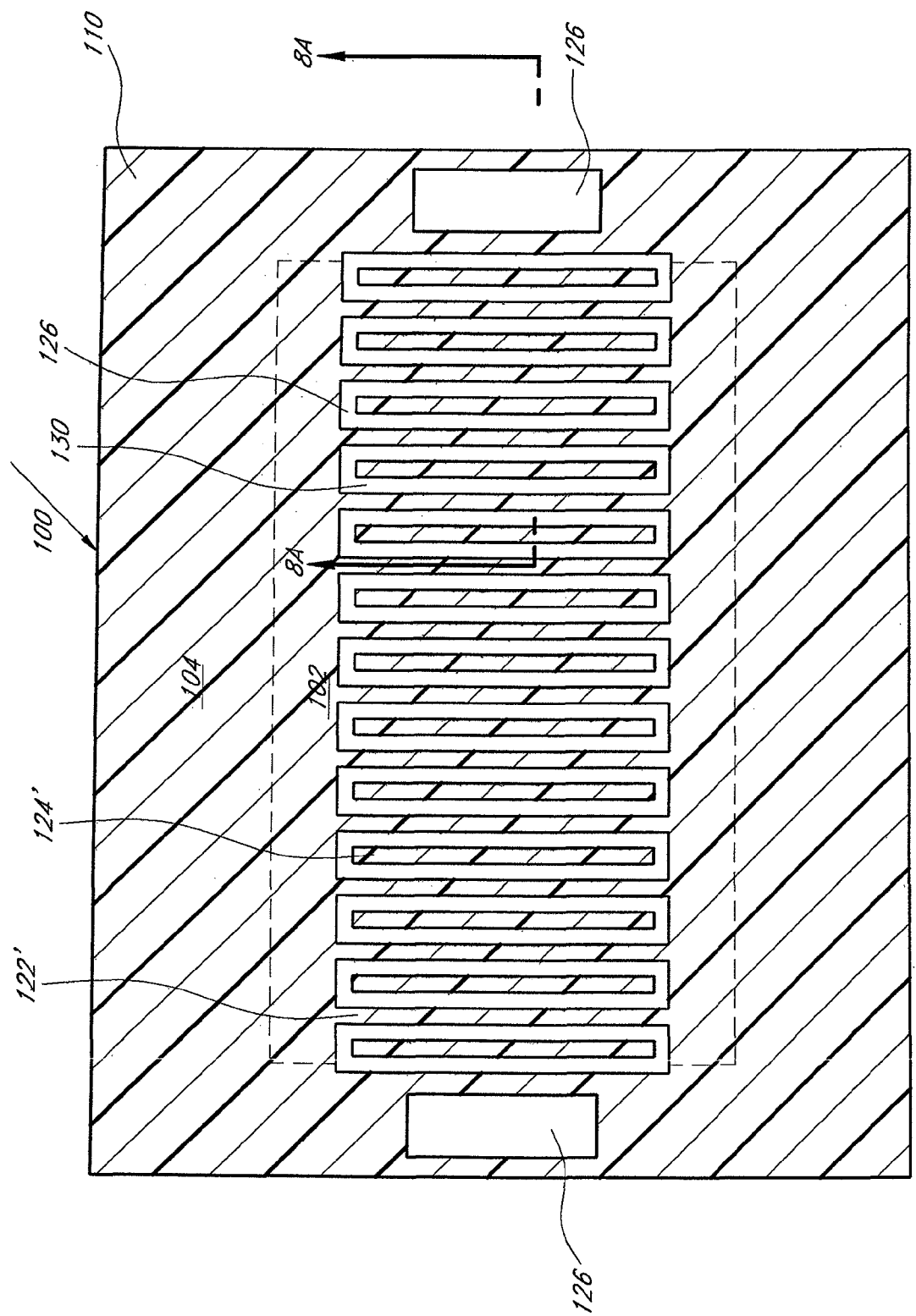
FIG. 8B is a schematic top view of the partially formed integrated circuit of FIG. 8A.

As illustrated in FIGS. 8A and 8B, the remaining exposed photoresist material is selectively etched from the partially formed integrated circuit 100. This includes the array photoresist layer 111, as well as the periphery photoresist material 128. This results in the formation of freestanding spacers 130 separated by modified trenches 122'. The periphery features are now defined by the remaining low temperature spacer material 126 in the peripheral region 104. Thus, the array photoresist layer 111 is used as a mandrel to form the spacers 130. The photoresist material is selectively removed using an organic strip process. Preferred etch chemistries include an oxygen-containing plasma etch, such as an etch using $SO_2$. In embodiments wherein the peripheral photoresist layer 128 is deposited directly on the second hard mask layer 110, the photoresist material is selectively etched from only the array region 102 of the integrated circuit 100. Alternatively, in such embodiments the photoresist material is etched from both the array region 102 and the peripheral region 104, followed by a subsequent deposition of photoresist material in the peripheral region 104.

Figure 9A:
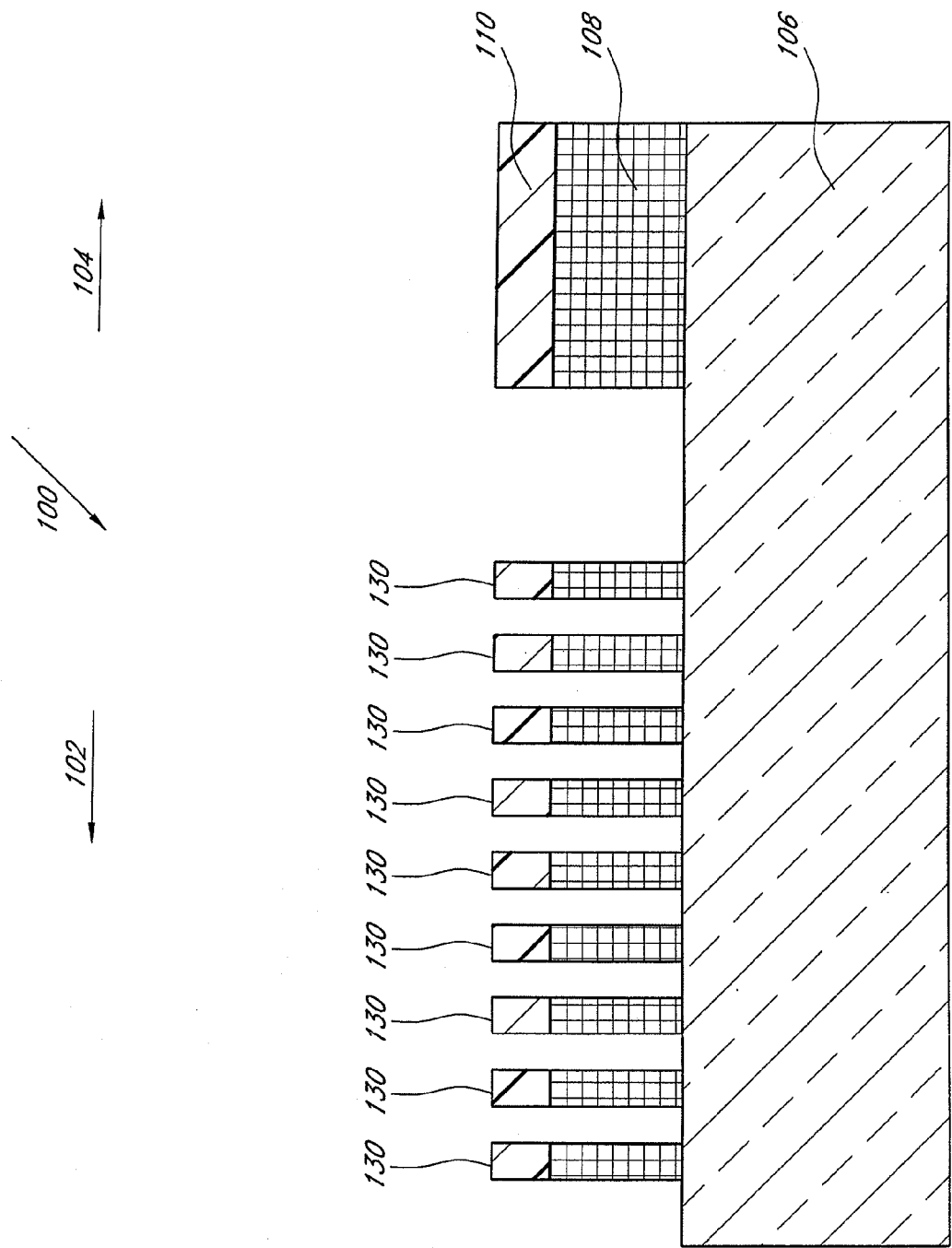
FIG. 9A is a schematic cross-sectional view of the example partially formed integrated circuit of FIG. 8A after transferring the pattern of spacers into underlying hard mask layers.
Figure 9B:
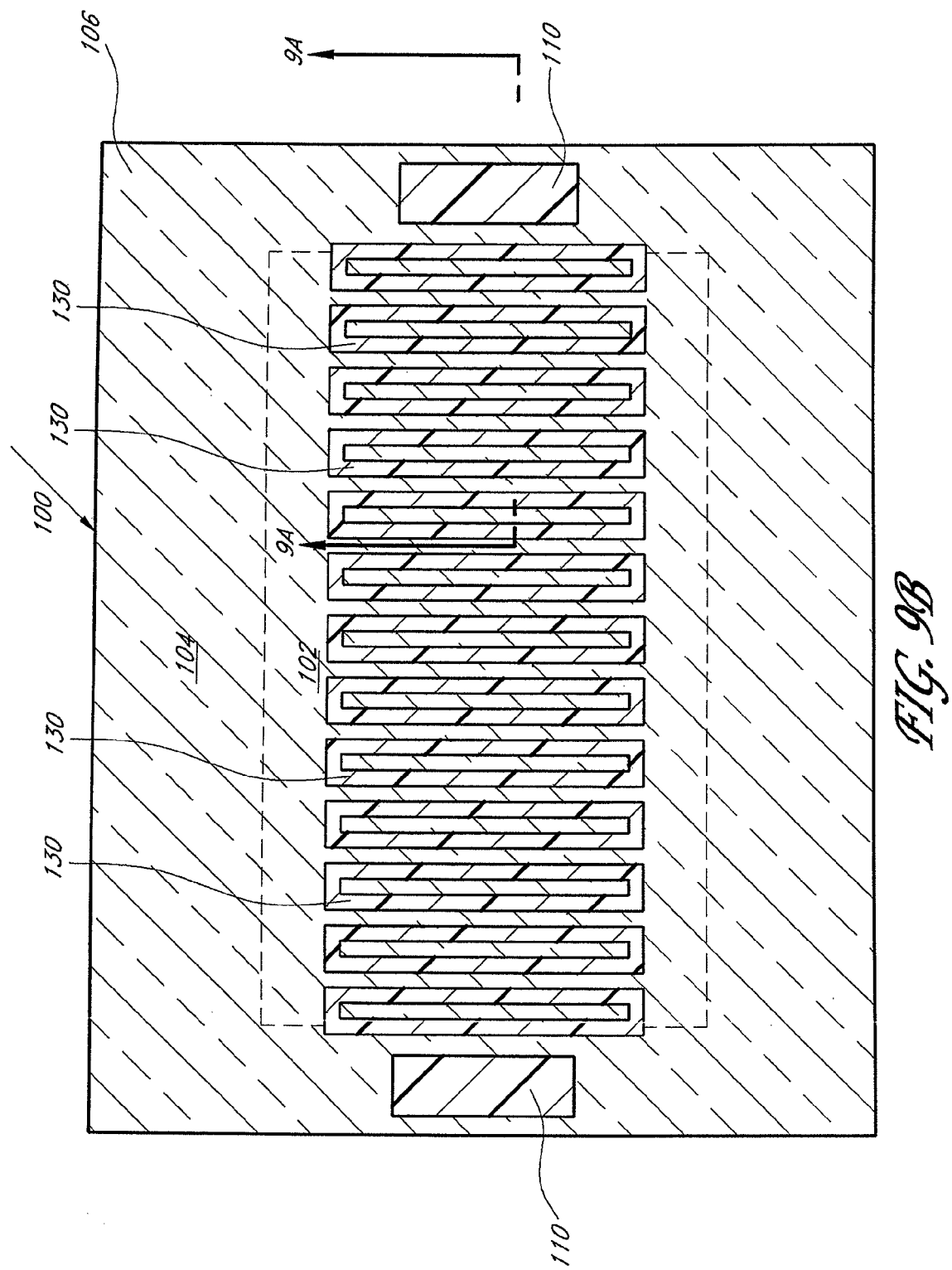
FIG. 9B is a schematic top view of the partially formed integrated circuit of FIG. 9A.

After the freestanding spacers 130 are formed, subsequent processing steps can be conducted, such as a dry develop step and an in situ etch step. The subsequent processing steps can be used to transfer the pattern of spacers 130 and periphery features to the underlying first hard mask layer 108 and/or the second hard mask layer 110, as illustrated in FIGS. 9A and 9B. Specifically, FIGS. 9A and 9B illustrate the pattern of spacers 130 defined in the first hard mask layer 108 and the second hard mask layer 110. The second hard mask layer 110 is optionally etched from the structure illustrated in FIGS. 9A and 9B. This pattern can then be transferred into the underlying substrate 106 by etching of the underlying substrate 106. The structure can also be otherwise processed (such as by doping, oxidizing, nitridizing, or selectively depositing) through the pattern defined in the first hard mask layer 108 and/or the second hard mask layer 110. As noted herein, the substrate 106 can include previously deposited layers, such as insulating layers for damascene metallization, or metal layers for conventional metallization.

Certain of the techniques disclosed herein advantageously enable the formation of a pitch doubled pattern of spacers to be formed in the array region without the use of additional layers to define the array features, such as a top carbon layer and an amorphous silicon layer. Specifically, by forming low temperature oxide spacers directly on the array photoresist layer 111 as disclosed herein, the photoresist material itself can be used to define mandrels which are used in a subsequent pitch multiplication technique. This advantageously eliminates the need to pattern additional masking layers to define mandrels. Such techniques advantageously allow process steps associated with such additional masking layers to be eliminated, such as additional dry develop steps and hard mask etch steps. Furthermore, such techniques also advantageously allow the periphery photoresist layer 128 to be defined using the same low temperature spacer material that is used to form the spacers in the array region. Certain of the embodiments disclosed herein also advantageously allow a hard mask material—as compared to a more vulnerable photoresist material—to be used to block and define features in the peripheral region 104 without requiring the use of a separate hard mask layer.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than integrated circuit fabrication.

We claim:

1. A method for fabricating a semiconductor device, the method comprising:

patterning a layer of photoresist material to form a plurality of photoresist mandrels over a hard mask layer, the photoresist mandrels having a pitch of about 150 nm or less;

using an atomic layer deposition technique to blanket deposit an oxide material onto the plurality of mandrels;

depositing another layer of photoresist material on the blanket deposited oxide material;

patterning the other layer of photoresist material;

anisotropically etching the oxide material to form spacers on sidewalls of mandrels and to pattern oxide under the patterned other layer of photoresist material;

etching the photoresist material of the layer of photoresist material and the other layer of photoresist material selectively with respect to the oxide material, thereby forming a plurality of free-standing oxide spacers over the hard mask layer;

transferring a pattern defined by the spacers and the patterned oxide to the hard mask layer; and transferring the pattern to a substrate underlying the hard mask layer.

2. The method of claim 1, wherein the oxide material is deposited using a precursor selected from the group consisting of $Si_2Cl_6$, $H_2O$ and $C_5H_5N$.

3. The method of claim 1, wherein:

the plurality of mandrels are formed in a device array region; and the oxide material is also deposited over a device peripheral region.

4. The method of claim 1, further comprising isotropically etching the plurality of mandrels to form a plurality of modified mandrels before depositing the oxide material.

5. The method of claim 4, wherein isotropically etching the plurality of mandrels comprises using an oxygen-containing plasma selected from the group consisting of a $SO_2/O_2/N_2/Ar$ plasma, a $Cl_2/O_2/He$ plasma, and a $HBr/O_2/N_2$ plasma.

6. The method of claim 4, wherein the modified mandrels have a width between about 35 nm and about 70 nm.

7. The method of claim 1, wherein patterning the layer of photoresist comprises using nano-imprint lithography.

8. The method of claim 1, wherein anisotropically etching the oxide material comprises using a $HBr/Cl_2$-containing plasma.

9. The method of claim 1, wherein the oxide material is deposited at a temperature less than about 100° C.

10. The method of claim 1, wherein the oxide material is deposited at a temperature less than about 80° C.

11. The method of claim 1, wherein the layer of photoresist material is patterned over a silicon oxynitride layer that is positioned over a carbon layer.

12. The method of claim 1, wherein the plurality of mandrels have a height between about 50 nm and about 300 nm.

13. The method of claim 1, wherein the layer of photoresist material comprises a material selected from the group consisting of argon fluoride photoresist, and krypton fluoride photoresist.

* * * * *

UNITED STATES PATENT AND TRADEMARK OFFICE
CERTIFICATE OF CORRECTION

PATENT NO. : 7,732,343 B2
APPLICATION NO. : 11/744074
DATED : June 8, 2010
INVENTOR(S) : Ardavan Niroomand et al.

It is certified that error appears in the above-identified patent and that said Letters Patent is hereby corrected as shown below:

On the Title page, in field (56), under "U.S. Patent Documents", in column 2, line 6, delete "Bhattascharyya" and insert -- Bhattacharyya --, therefor.

In column 1, line 15, delete "2005;" and insert -- 2005); --, therefor.

Signed and Sealed this

Twenty-fourth Day of August, 2010

David J. Kappos
*Director of the United States Patent and Trademark Office*